United States Patent
Yoneda et al.

(10) Patent No.: US 11,469,389 B2
(45) Date of Patent: Oct. 11, 2022

(54) DISPLAY PANEL AND DISPLAY PANEL MANUFACTURING METHOD

(71) Applicant: JOLED Inc., Tokyo (JP)

(72) Inventors: Kazuhiro Yoneda, Tokyo (JP); Takahiro Komatsu, Tokyo (JP)

(73) Assignee: JOLED INC., Tokyo (JP)

(*) Notice: Subject to any disclaimer, the term of this patent is extended or adjusted under 35 U.S.C. 154(b) by 84 days.

(21) Appl. No.: 17/088,602

(22) Filed: Nov. 4, 2020

(65) Prior Publication Data
US 2021/0151709 A1 May 20, 2021

(30) Foreign Application Priority Data

Nov. 14, 2019 (JP) ............................ JP2019-206297

(51) Int. Cl.
*H01L 51/52* (2006.01)
*H01L 51/56* (2006.01)
*H01L 27/32* (2006.01)

(52) U.S. Cl.
CPC ...... *H01L 51/5212* (2013.01); *H01L 27/3218* (2013.01); *H01L 27/3246* (2013.01); *H01L 51/5215* (2013.01); *H01L 51/5228* (2013.01); *H01L 51/5234* (2013.01); *H01L 51/56* (2013.01); *H01L 2251/5315* (2013.01); *H01L 2251/558* (2013.01)

(58) Field of Classification Search
None
See application file for complete search history.

(56) References Cited

U.S. PATENT DOCUMENTS

| | | |
|---|---|---|
| 2004/0056591 A1 | 3/2004 | Koo et al. |
| 2004/0222737 A1 | 11/2004 | Raychaudhuri et al. |
| 2006/0220534 A1 | 10/2006 | Shibanuma et al. |
| 2007/0210705 A1 | 9/2007 | Yokoi et al. |
| 2010/0084646 A1 | 4/2010 | Matsusue et al. |
| 2010/0213438 A1 | 8/2010 | Cho et al. |
| 2012/0146062 A1 | 6/2012 | Oda |
| 2018/0294428 A1* | 10/2018 | Nishimura .......... H01L 51/5234 |

(Continued)

FOREIGN PATENT DOCUMENTS

| | | |
|---|---|---|
| JP | 2004111369 A | 4/2004 |
| JP | 2004335468 A | 11/2004 |
| JP | 2006287078 A | 10/2006 |

(Continued)

*Primary Examiner* — Michelle Mandala
(74) *Attorney, Agent, or Firm* — Xsensus LLP

(57) ABSTRACT

A display panel including a power supplying auxiliary electrode above the substrate in at least one gap among gaps between pixel electrodes in row and column directions, not in contact with the pixel electrodes, extending in the row and/or column direction. An intermediate layer is on or above light-emitting layers and the auxiliary electrode, and includes a fluoride of an alkali metal or an alkaline earth metal. A functional layer is on or above the intermediate layer, and includes an organic material that facilitates electron transport and/or facilitates electron injection and a rare earth metal dopant. A counter electrode is on or above the functional layer. Further, $1 \leq x \leq 3$, $20 \leq y \leq 40$, and $y \geq 10x+10$, where x is film thickness of the intermediate layer in nanometers, and y is percentage by weight of the rare earth metal dopant in the functional layer.

10 Claims, 20 Drawing Sheets

(56) References Cited

U.S. PATENT DOCUMENTS

2019/0131558 A1* 5/2019 Mishima ............. H01L 51/5265
2020/0136079 A1* 4/2020 Mishima ............. H01L 51/5072

FOREIGN PATENT DOCUMENTS

| JP | 2007317378 A | 12/2007 |
| JP | 200878414 A | 4/2008 |
| JP | 2008177459 A | 7/2008 |
| JP | 2008218396 A | 9/2008 |
| JP | 2010199067 A | 9/2010 |
| JP | 2012238913 A | 12/2012 |
| WO | 2009/110186 A1 | 9/2009 |

* cited by examiner

| | wavelength[nm] | Ba | Yb | Yb/Ba |
|---|---|---|---|---|
| B | 450 | 0.09898 | 0.0916 | 0.925 |
| G | 520 | 0.08849 | 0.0881 | 0.996 |
| R | 620 | 0.1116 | 0.09914 | 0.888 |

FIG. 7

| Sample No. | 1 | 2 | 3 | 4 | 5 | 6 | 7 | 8 |
|---|---|---|---|---|---|---|---|---|
| Yb concentration in organic functional layer [wt%] | 10 | | | | | | | |
| Film thickness of intermediate layer [nm] | 1 | 2 | 3 | 4 | 1 | 2 | 3 | 4 |
| Contact resistance [Ω] | Measurement limit | Measurement limit | Measurement limit | Measurement limit | 4.89E+05 | 1.66E+06 | Measurement limit | Measurement limit |

| Sample No. | 9 | 10 | 11 | 12 | 13 | 14 | 15 | 16 |
|---|---|---|---|---|---|---|---|---|
| Yb concentration in organic functional layer [wt%] | 30 | | | | 40 | | | |
| Film thickness of intermediate layer [nm] | 1 | 2 | 3 | 4 | 1 | 2 | 3 | 4 |
| Contact resistance [Ω] | 1.79E+05 | 3.80E+05 | 1.41E+06 | 2.88E+06 | 5.05E+04 | 1.48E+05 | 3.51E+05 | 8.53E+05 |

DISPLAY PANEL AND DISPLAY PANEL MANUFACTURING METHOD

This application claims priority to Japanese Patent Application No. 2019-206297, filed Nov. 14, 2019, the contents of which are hereby incorporated by reference in their entirety.

BACKGROUND

Technical Field

The present disclosure relates to display panels in which self-luminous light-emitting elements such as organic electroluminescence (EL) elements are two-dimensionally arranged across a main surface of a substrate, and to methods of manufacturing such display panels.

Description of Related Art

In recent years, organic EL display panels in which organic EL elements are arranged in a matrix of rows and columns across a substrate have been put into practical use as light-emitting displays of electronic devices.

Each organic EL element has a basic structure of a current-driven light-emitting element in which an organic light-emitting layer including an organic light-emitting material is disposed between a pair of electrodes, a pixel electrode (anode) and a counter electrode (cathode). When driven, a voltage is applied between the pair of electrodes, and recombination of holes injected to the organic light-emitting layer from the pixel electrode and electrons injected to the organic light-emitting layer from the counter electrode causes light emission.

Particularly in an organic EL display panel driven by an active matrix method, a counter electrode as a cathode is often common to a plurality of pixels. In such a case, voltage is applied from a peripheral portion of the counter electrode, and therefore a voltage drop occurs in a central portion of the counter electrode due to electrical resistance (sheet resistance) of the counter electrode.

A distance from a pixel to the peripheral portion of the counter electrode is different for each pixel, and therefore a voltage applied between a pixel electrode and the cathode varies for each pixel, resulting in uneven brightness in the organic EL display panel (hereinafter also referred to as "uneven brightness due to sheet resistance").

To address this, a structure is disclosed in Japanese Patent Application Publication No. 2004-111369 in which an auxiliary electrode extending in a column direction is provided on the substrate, and the sheet resistance of the counter electrode is lowered by electrically connecting the auxiliary electrode and the counter electrode to suppress the uneven brightness due to sheet resistance.

Further, in such an organic EL display panel, in order to improve injectability of electrons from the counter electrode into the organic light-emitting layers, a functional layer of an organic material doped with an alkali metal or alkaline earth metal having a low work function is disposed between the counter electrode and the organic light-emitting layers.

Alkali metals and alkaline earth metals have a disadvantage that their electron injection properties tend to deteriorate on reaction with impurities such as water and oxygen. In particular, when an organic light-emitting layer or a hole transport layer is formed by a wet process, impurities such as water and oxygen may remain in such a layer or on a surface of such a layer, which may cause deterioration of an alkali metal or alkaline earth metal in a functional layer.

To address this, Japanese Patent Application Publication No. 2007-317378 discloses a technique for blocking infiltration of impurities such as water into the functional layer by providing an intermediate layer composed of a fluoride of an alkali metal or alkaline earth metal between the light-emitting layers and the functional layer.

SUMMARY

A display panel according to at least one embodiment of the present disclosure is a display panel in which pixel electrodes are arranged in a matrix of rows and columns above a substrate and a light-emitting layer is disposed on or above each of the pixel electrodes. The display panel includes a power supplying auxiliary electrode, an intermediate layer, a functional layer, and a counter electrode. The power supplying auxiliary electrode is disposed above the substrate in at least one gap among gaps between the pixel electrodes in a row direction and a column direction, in a non-contact state with the pixel electrodes, and extends in the row direction and/or the column direction. The intermediate layer is disposed on or above the light-emitting layers and the auxiliary electrode, and includes a fluoride of a first metal that is an alkali metal or an alkaline earth metal. The functional layer is disposed on or above the intermediate layer, and includes an organic material that has at least one of a property of facilitating electron transport and a property of facilitating electron injection and a dopant of a second metal that is a rare earth metal. The counter electrode is disposed on or above the functional layer. Further, $1 \leq x \leq 3$, $20 \leq y \leq 40$, and $y \geq 10x+10$, where x is film thickness of the intermediate layer in nanometers, and y is percentage by weight of the second metal dopant in the functional layer.

BRIEF DESCRIPTION OF DRAWINGS

Objects, advantages, and features of the technology pertaining to the present disclosure will become apparent from the following description thereof taken in conjunction with the accompanying drawings, which illustrate at least one embodiment of the technology pertaining to the present disclosure.

FIG. 7 is a table that shows results of measuring contact resistance between an auxiliary electrode and the counter electrode in organic EL display panels samples including organic EL elements according to at least one embodiment, each sample having different combinations of Yb dopant concentration in a functional layer and film thickness of an intermediate layer.

DETAILED DESCRIPTION

Background to Aspect of Present Disclosure

Figure 1:
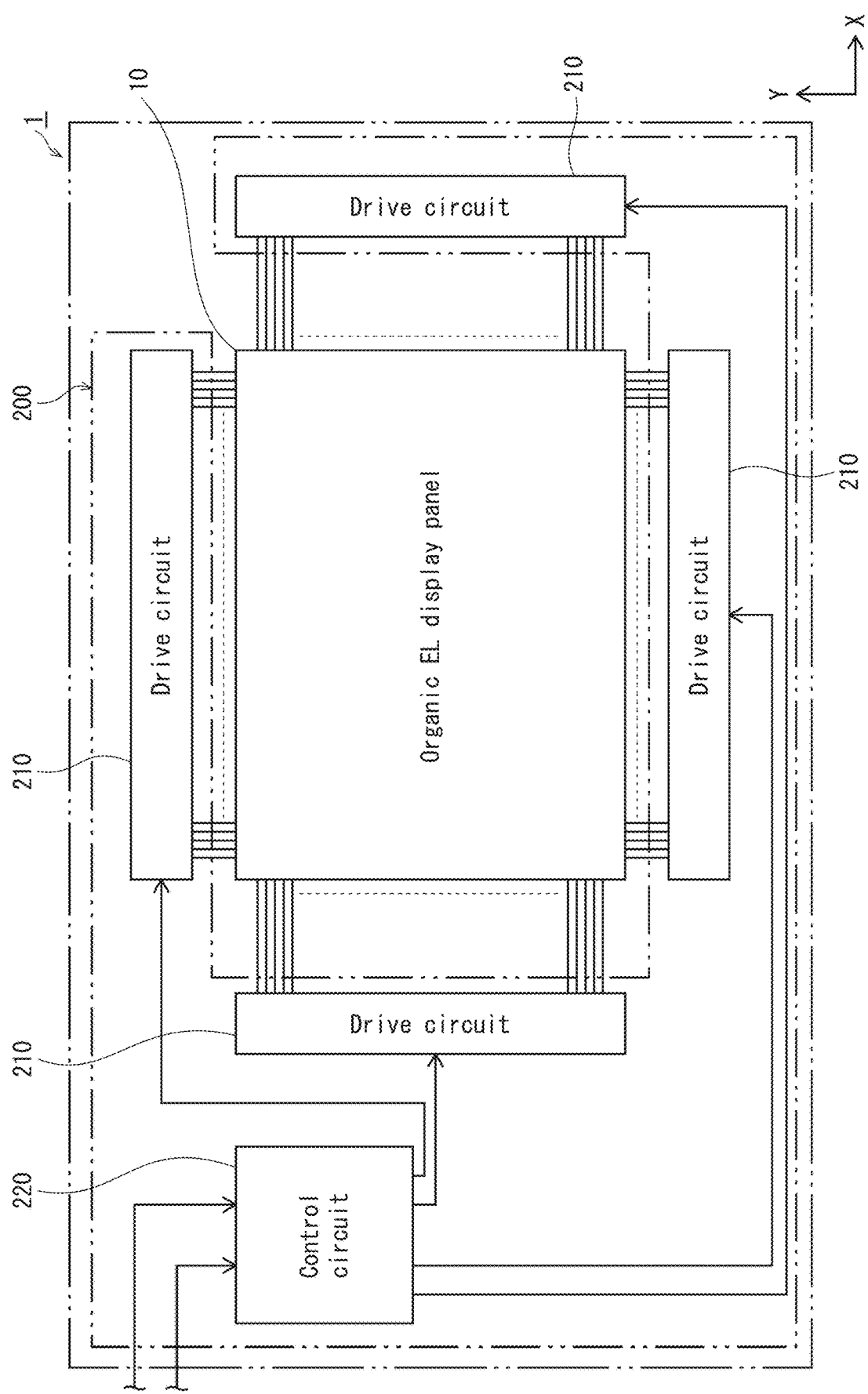
FIG. 1 is a block diagram illustrating an overall structure of an organic EL display device according to at least one embodiment.

As written above, Japanese Patent Application Publication 2007-317378 discloses a technique for blocking infiltration of impurities such as water into a functional layer by providing an intermediate layer composed of a fluoride of an alkali metal or alkaline earth metal between light-emitting layers and the functional layer.

However, fluorides of alkali metals and alkaline earth metals are highly insulative, and therefore film thickness of such a layer cannot be too thick, in order to maintain good electron injectability. Accordingly, there is a risk of impurities such as water gradually permeating, and deteriorating the alkali metal or alkaline earth metal in the functional layer.

On the other hand, in an organic EL display panel, a layer disposed above light-emitting layers does not need to be divided up into pixels, and therefore in view of simplification of manufacture and cost reduction, it is desirable to form a single layer common to all pixels.

In such a case, auxiliary electrodes and the counter electrode cannot be brought into direct contact with each other as an intermediate layer or functional layer is disposed between the auxiliary electrodes and the counter electrode, and therefore electrical resistance between the auxiliary electrodes and the counter electrode (hereinafter also referred to as "contact resistance") becomes large, the function of the auxiliary electrodes can be sufficiently fulfilled, and there is a possibility that uneven brightness caused by the sheet resistance of the counter electrode cannot be eliminated.

In view of the above, and as a result of diligent research to provide a display panel in which contact resistance between an auxiliary electrode and a counter electrode is reduced, occurrence of uneven brightness is suppressed, luminance efficiency can be improved, and life can be extended, and a method of manufacturing same, the inventors of the present application arrived at an aspect of the present disclosure.

Overview of Aspects of Present Disclosure

A display panel according to at least one embodiment of the present disclosure is a display panel in which pixel electrodes are arranged in a matrix of rows and columns above a substrate and a light-emitting layer is disposed on or above each of the pixel electrodes. The display panel includes a power supplying auxiliary electrode, an intermediate layer, a functional layer, and a counter electrode. The power supplying auxiliary electrode is disposed above the substrate in at least one gap among gaps between the pixel electrodes in a row direction and a column direction, in a non-contact state with the pixel electrodes, and extends in the row direction and/or the column direction. The intermediate layer is disposed on or above the light-emitting layers and the auxiliary electrode, and includes a fluoride of a first metal that is an alkali metal or an alkaline earth metal. The functional layer is disposed on or above the intermediate layer, and includes an organic material that has at least one of a property of facilitating electron transport and a property of facilitating electron injection and a dopant of a second metal that is a rare earth metal. The counter electrode is disposed on or above the functional layer. Further, $1 \le x \le 3$, $20 \le y \le 40$, and $y \ge 10x+10$, where x is film thickness of the intermediate layer in nanometers, and y is percentage by weight of the second metal dopant in the functional layer.

According to this structure, the second metal dopant in the functional layer is a rare earth in order to improve facilitation of electron injection. Rare earth metals have low reactivity with impurities such as water, and therefore life of a display panel can be extended. Further, the film thickness x (nm) of the intermediate layer and the functional layer dopant concentration y (wt %) satisfy $1 \le x \le 3$, $20 \le y \le 40$, and $y \ge 10x+10$, and therefore electrical resistance between the auxiliary electrode and the counter electrode that is the cathode falls within an appropriate range. As a result, the function of the power supplying auxiliary electrode is exhibited, variation in voltage of the counter electrode is eliminated, and uneven luminance of the display panel can be suppressed.

According to at least one embodiment, the first metal is Na.

Fluorides of alkali metals and alkaline earth metals are crystalline and can be expected to block impurities. In particular, NaF has a superior blocking quality, as it is more soluble in water than other fluorides of alkali metals and alkaline earth metals, and absorbs and traps moisture and the like, and therefore there is little risk of moisture and the like that is blocked and repelled adversely affecting other elements of the display.

According to at least one embodiment, the second metal is Yb.

Yb has a low work function among the rare earth metals and is more stable with respect to impurities such as water than alkali metals and alkaline earth metals, and therefore produce life can be extended while improving luminance efficiency.

According to at least one embodiment, the pixel electrodes and the power supplying auxiliary electrode are made of the same material.

According to this structure, the pixel electrodes and the power supplying auxiliary electrodes can be formed by using the same material in one process, which contributes to an improvement in work efficiency by reducing the number of steps and contributes to cost reduction due to standardization of materials.

According to at least one embodiment, a proportion of the second metal to the organic material in the functional layer increases continuously with increasing proximity to the counter electrode. According to at least one embodiment, the functional layer includes a first sublayer disposed on the intermediate layer and a second sublayer disposed on the first sublayer, and a proportion of the second metal to the organic material in the second sublayer is greater than a proportion of the second metal to the organic material in the first sublayer.

According to this structure, a proportion of the second metal is obtained on the intermediate layer side of the functional layer necessary for the first metal in the intermediate layer to be reduced by an appropriate amount to ensure facilitation of electron injection and blocking by the intermediate layer, and a proportion of the second metal on the counter electrode side of the functional layer is greater, and therefore electron injection facilitation from the counter electrode side to the functional layer is improved while infiltration of impurities from outside is prevented. As a result, life of the display panel can be further extended. Further, since concentration of the second metal in the film thickness direction of the functional layer has this relationship, a dopant amount of the second metal is not increased so much in the functional layer as a whole, and therefore further reduction in light transmission can be prevented.

According to at least one embodiment, the functional layer is a stack of a first sublayer, a second sublayer, and a third sublayer in this order of increasing distance from the intermediate layer, and $D2<D1 \leq D3$, where $D1$, $D2$, and $D3$ are proportions of the second metal to the organic material in the first sublayer, the second sublayer, and the third sublayer, respectively.

By varying the concentration of the second metal in the film thickness direction of the functional layer in this way, in the first sublayer the fluoride of the first metal blocks impurities while appropriately reducing the second metal by an amount necessary to improve electron injection to the light-emitting layer, and in the third sublayer the high dopant concentration improves electron injection from the counter electrode side to the functional layer while blocking infiltration of impurities from outside, which can further extend life of the display panel. Further, in the second sublayer, the reduction of the dopant amount of the second metal means that the amount of the second metal in the functional layer as a whole is not increased so much, and therefore light transmission can be decreased no more than necessary.

According to at least one embodiment, a light-transmissive electrically conductive film is disposed between the functional layer and the counter electrode.

According to this structure, adjustment of film thickness of the light-transmissive electrically conductive film allows adjustment of optical resonator structures according to emission color wavelengths.

According to at least one embodiment, the light-emitting layers are separated by banks that extend in the column direction between the pixel electrodes that are adjacent in the row direction.

According to this structure, a line bank display panel is provided. As a result, when the light-emitting layers are formed by a wet process, film thicknesses can be made uniform. In this case, an area of contact between the intermediate layer and the light-emitting layers increases and therefore a possibility that impurities contained in the light-emitting layers infiltrate into the intermediate layer and the functional layer also increases. However, the dopant metal of the functional layer is a rare earth metal and therefore sufficient resistance to impurities is exhibited and product life can be extended when compared to use of alkali metals or alkaline earth metals.

According to at least one embodiment, the display panel is a top-emission type of display panel.

In a top-emission type of the display panel, the drive circuits consisting of TFTs and the like are not disposed in the direction of emitted light, and therefore aperture ratios of each light-emitting section can be increases, luminance efficiency is excellent, and the power supplying auxiliary electrodes and the pixel electrodes can be made from the same material in a common layer, which simplifies manufacture and contributes to cost reduction.

A display panel manufacturing method according to at least one embodiment is a manufacturing method including: forming pixel electrodes and a power supplying auxiliary electrode above the substrate, the power supplying auxiliary electrode extending in a direction parallel to a main surface of the substrate, separated from the pixel electrodes; forming light-emitting layers above on or above the pixel electrodes; forming an intermediate layer on or above the light-emitting layers and the auxiliary electrode, the intermediate layer including a fluoride of a first metal that is an alkali metal or an alkaline earth metal; forming a functional layer on or above the intermediate layer, the functional layer including an organic material that has at least one of a property of facilitating electron transport and a property of facilitating electron injection and a dopant of a second metal that is a rare earth metal; and forming a counter electrode on or above the functional layer. According to the manufacturing method, $1 \leq x \leq 3$, $20 \leq y \leq 40$, and $y \geq 10x+10$, where x is film thickness of the intermediate layer in nanometers, and y is percentage by weight of the second metal dopant in the functional layer.

According to this method, a display panel can be made with improved luminance efficiency and extended life, electrical resistance between the auxiliary electrodes and the counter electrode can be set within an appropriate range, and voltage can be evenly applied over the entire display surface, suppressing variation in voltage and uneven luminance.

At least one embodiment of the method further includes forming hole transfer facilitating layers between the forming of the pixel electrodes and the forming of the light-emitting layers, the hole transfer facilitating hole injection and/or hole transfer, wherein the hole transfer facilitating layers and/or the light-emitting layers are formed by a wet process.

Thus, even when the light-emitting layers and/or the hole transfer facilitating layers are formed by wet processes in order to reduce manufacturing costs, the dopant metal of the functional layer is highly stable with respect to impurities, and therefore life can be extended.

In the embodiments described above "on or above" does not necessarily mean an upward direction in absolute space, but indicates relative positions based on a stacking order of the structure of the light-emitting sections. More specifically, the direction perpendicular to the main surface of the substrate, from the substrate towards a stack of a light-emitting section. Further, for example, "on or above the substrate" means not only a region in direct contact with the substrate, but also includes a region above the substrate.

Embodiments

The following describes a display panel according to one aspect of the present disclosure, with reference to the drawings and using an organic EL display panel as an example. Note that the drawings may be schematic, and are not necessarily to scale.

1. Overall Structure of Organic EL Display Device 1

FIG. 1 is a block diagram illustrating an overall structure of an organic EL display device 1 incorporating an organic EL display panel 10 according to an aspect of the present disclosure. The organic EL display device 1 is a display device used for, for example, a television, a personal computer, a mobile terminal, a commercial display (electronic signboard, large screen for a commercial facility), or the like.

The organic EL display device 1 includes the organic EL display panel 10 and a drive controller 200 electrically connected thereto.

According to at least one embodiment, the organic EL display panel 10 is a top emission type display panel, a top surface of which is a rectangular image display surface. In the organic EL display panel 10, organic EL elements (not illustrated) are arranged along the image display surface, and an image is displayed by combining light emission of the organic EL elements. According to at least one embodiment, the organic EL display panel 10 employs an active matrix.

The drive controller 200 includes drive circuits 210 connected to the organic EL display panel 10 and a control circuit 220 connected to an external device such as a computer or a signal receiver such as an antenna. The drive circuits 210 include a power supply circuit supplying electric power to each of the organic EL elements, a signal circuit for applying a voltage signal for controlling the electric power supplied to each of the organic EL elements, a scanning circuit at regular intervals for switching a position to which the voltage signal is applied, and the like.

The control circuit 220 controls operations of the drive circuits 210 according to data including image information input from the external device or the signal receiver.

In FIG. 1, as an example, four of the drive circuits 210 are disposed around the organic EL display panel 10, but structure of the drive controller 200 is not limited to this example, and the number and position of the drive circuits 210 may be modified as appropriate. In the following explanation, as illustrated in FIG. 1, a direction along a long edge of a top surface of the organic EL display panel 10 is referred to as an X direction and a direction along a short edge of the top surface of the organic EL display panel 10 is referred to as a Y direction.

2. Structure of Organic EL Display Panel 10

(A) Plan View Structure

Figure 2:
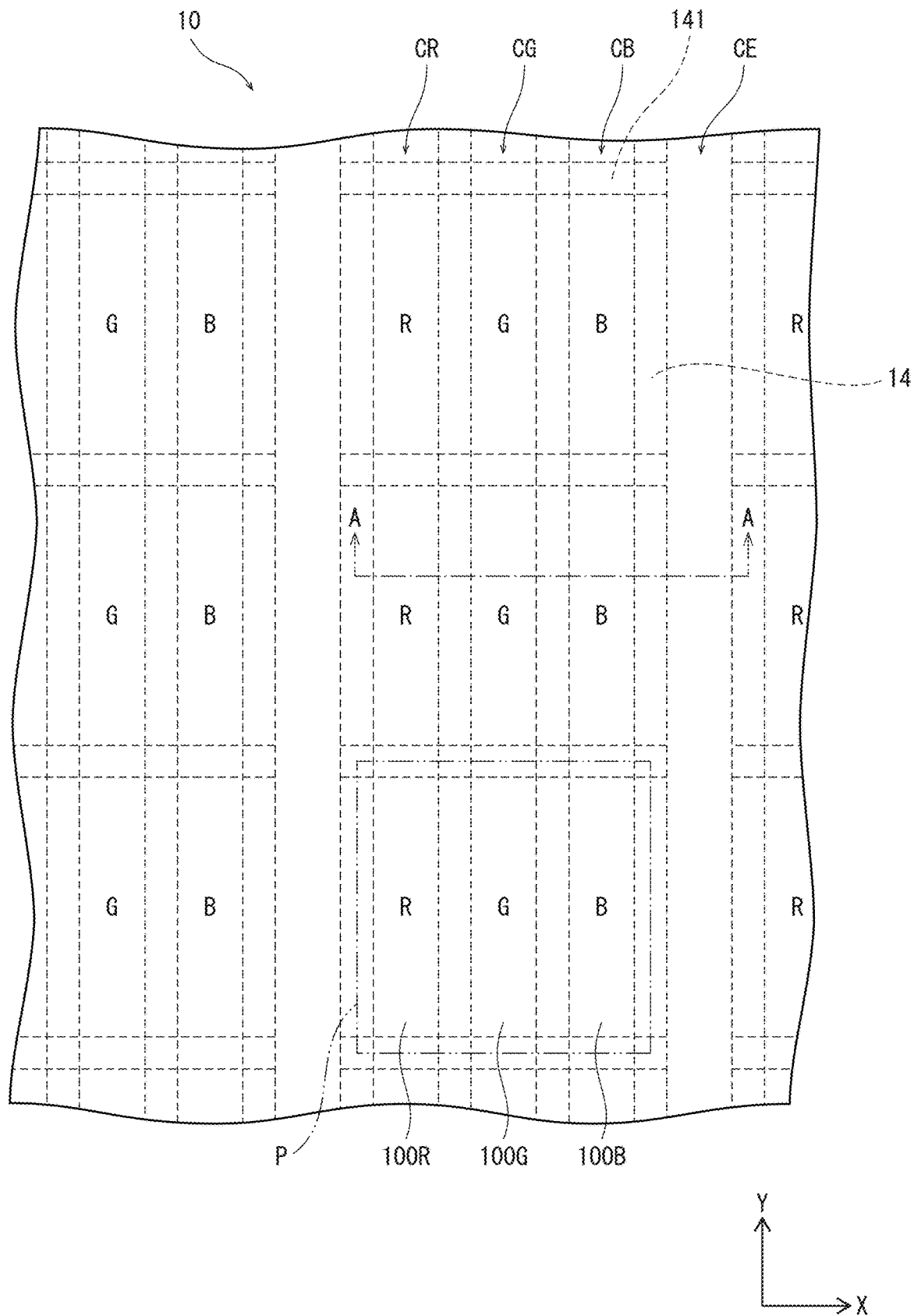
FIG. 2 is a schematic plan view enlargement of a portion of an image display face of the organic EL display panel of the organic EL display device.

FIG. 2 is a schematic plan view enlargement of a portion of an image display face of the organic EL display panel 10. According to at least one embodiment of the organic EL display panel 10, sub-pixels 100R, 100G, 100B are arranged in a matrix and emit red (R), green (G), and blue (B) colors of light, respectively. The sub-pixels 100R, 100G, 100B are lined up alternating in the X direction, and a set of the sub-pixels 100R, 100G, 100B in the X direction constitute one pixel P. The pixel P can express full color via combinations of graded light emission from the sub-pixels 100R, 100G, 100B.

In addition, in the Y direction, the sub-pixels 100R, the sub-pixels 100G, and the sub-pixels 100B are arranged to form sub-pixel columns CR, sub-pixel columns CG, and sub-pixel columns CB, respectively, in which only the corresponding color of sub-pixel is present. As a result, across the organic EL display panel 10, the pixels P are arranged in a matrix along the X direction and the Y direction, and an image is displayed on the image display face through a combination of colors of light emitted by the pixels P.

Organic EL elements 2(R), 2(G), 2(B) that emit light in the colors R, G, B are disposed in the sub-pixels 100R, 100G, 100B, respectively.

The organic EL display panel 10 according to at least one embodiment employs a line bank structure. That is, the sub-pixel columns CR, CG, CB are partitioned by banks 14 at intervals in the X direction, and in each of the sub-pixel columns CR, CG, CB, the sub-pixels 100R, 100G, or 100B therein share a continuous organic light-emitting layer.

However, in each of the sub-pixel columns CR, CG, CB, pixel regulation layers 141 are disposed at intervals in the Y direction to insulate the sub-pixels 100R, 100G, 100B from each other, such that each of the sub-pixels 100R, 100G, 100B can emit light independently.

Height of the pixel regulation layers 141 is set to be lower than height of a liquid level when ink of organic light-emitting layers is applied, such that height of the liquid level becomes uniform at the time of ink application.

In FIG. 2, the banks 14 and the pixel regulation layers 141 are indicated by dotted lines, and this is because the pixel regulation layers 141 and the banks 14 are not exposed on the surface of the image display face and are disposed inside the image display face.

According to at least one embodiment, an auxiliary electrode area CE is formed to be parallel with the sub-pixel columns CR, CG, CB. The auxiliary electrode area CE is separated from the adjacent sub-pixel columns CB, CR by the banks 14. In the auxiliary electrode areas CE, the pixel regulation layers 141 are not present, while auxiliary electrodes 131 that extend in the column direction (Y direction) are present at the same height as the pixel electrodes 13. More details of this are provided later.

(B) Cross-Section Structure

Figure 3:
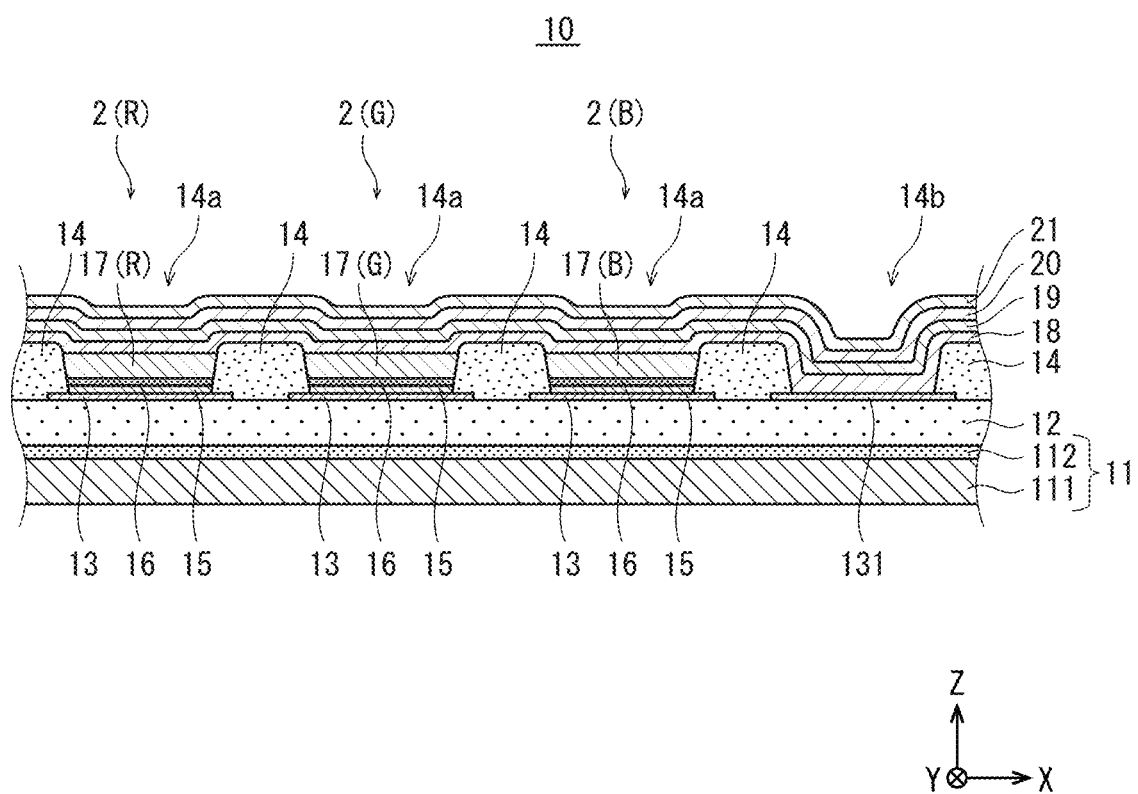
FIG. 3 is a schematic diagram of a cross-section of a portion of the organic EL display panel indicated by a line A-A in FIG. 2.

FIG. 3 is a schematic cross-section diagram of a cross-section along a line A-A in FIG. 2.

In the organic EL display panel 10, one pixel is composed of three sub-pixels that emit light in the colors R, G, B, and each of the sub-pixels includes a corresponding one of the organic EL elements 2(R), 2(G), 2(B).

The organic EL elements 2(R), 2(G), 2(B) of each light emission color have almost the same structure, and therefore may be described as organic EL elements 2 when not distinguished by color.

As illustrated in FIG. 3, the organic EL elements 2 include a substrate 11, an interlayer insulating layer 12, the pixel electrodes (anodes) 13, the banks 14, hole injection layers 15, hole transport layers 16, organic light-emitting layers 17, an intermediate layer 18, a functional layer 19, and a counter electrode (cathode) 20.

The interlayer insulating layer 12, the intermediate layer 18, the functional layer 19, the counter electrode 20, and the sealing layer 21 are not formed in one-to-one correspondence with each pixel, but are common to a plurality of the organic EL elements 2 of the organic EL display panel 10.

(1) Substrate

The substrate 11 includes a base 111 that is an insulative material, and a thin film transistor (TFT) layer 112. A drive circuit for each sub-pixel is formed in the TFT layer 112. According to at least one embodiment, the base 111 is a glass substrate, a quartz substrate, a silicon substrate, a metal substrate where the metal is molybdenum sulfide, copper, zinc, aluminum, stainless steel, magnesium, iron, nickel, gold, silver, or the like, a semiconductor substrate where the semiconductor is gallium arsenide or the like, a plastic substrate, or the like.

According to at least one embodiment, a plastic material of the plastic substrate is a thermoplastic resin or a thermosetting resin. According to at least one embodiment, the plastic material is polyethylene, polypropylene, polyamide, polyimide (PI), polycarbonate, acrylic resin, polyethylene terephthalate (PET), polybutylene terephthalate, polyacetal, another fluororesin, a styrene-based, polyolefin-based, polyvinyl chloride-based, polyurethane-based, fluororubber-based, or chlorinated polyethylene-based thermoplastic elastomer, an epoxy resin, an unsaturated polyester, a silicone resin, polyurethane, or the like, or a copolymer, blend, polymer alloy or the like primarily composed of one of the materials listed above, or a stack of two or more of the above.

(2) Interlayer Insulating Layer

The interlayer insulating layer 12 is disposed on the substrate 11. The interlayer insulating layer 12 is made of a resin material, and planarizes unevenness of an upper surface of the TFT layer 112. According to at least one embodiment, the resin material is a positive type photosensitive material. Examples of such photosensitive material include acrylic resin, polyimide resin, siloxane resin, and phenolic resin. Although not illustrated in the cross-section diagram of FIG. 3, for each sub-pixel a contact hole is formed in the interlayer insulating layer 12.

(3) Pixel Electrodes

Each of the pixel electrodes 13 includes a metal layer made of a light-reflective metal material, and is disposed on the interlayer insulating layer 12. The pixel electrodes 13 correspond one-to-one with the sub-pixels, and are electrically connected to the TFT layer 112 via the contact holes (not illustrated).

According to at least one embodiment, the pixel electrodes 13 function as anodes.

Examples of the light-reflective metal material include silver (Ag), aluminum (Al), aluminum alloy, molybdenum (Mo), silver palladium copper alloy (APC), silver rubidium gold alloy (ARA), molybdenum chromium alloy (MoCr), molybdenum tungsten alloy (MoW), nickel chromium alloy (NiCr), and the like.

According to at least one embodiment, each of the pixel electrodes is a single metal layer. According to at least one embodiment, each of the pixel electrodes is a stack in which a layer made of a metal oxide such as indium tin oxide (ITO) or indium zinc oxide (IZO) is stacked on the metal layer.

(4) Auxiliary Electrodes

Auxiliary electrodes 131 are provided on the interlayer insulating layer 12, separated from the pixel electrodes 13 in a direction parallel to a main surface of the substrate 11. The auxiliary electrodes 131 are made of an electrically conductive metal material such as aluminum. According to at least one embodiment, the auxiliary electrodes 131 are made of a plurality of stacked layers, each made of an electrically conductive material.

Further, according to at least one embodiment, the auxiliary electrodes 131 are made of the same material as the pixel electrodes 13. In this case, the pixel electrodes 13 and the auxiliary electrodes 131 can be made by the same process at the same time, simplifying manufacture.

Figure 4:
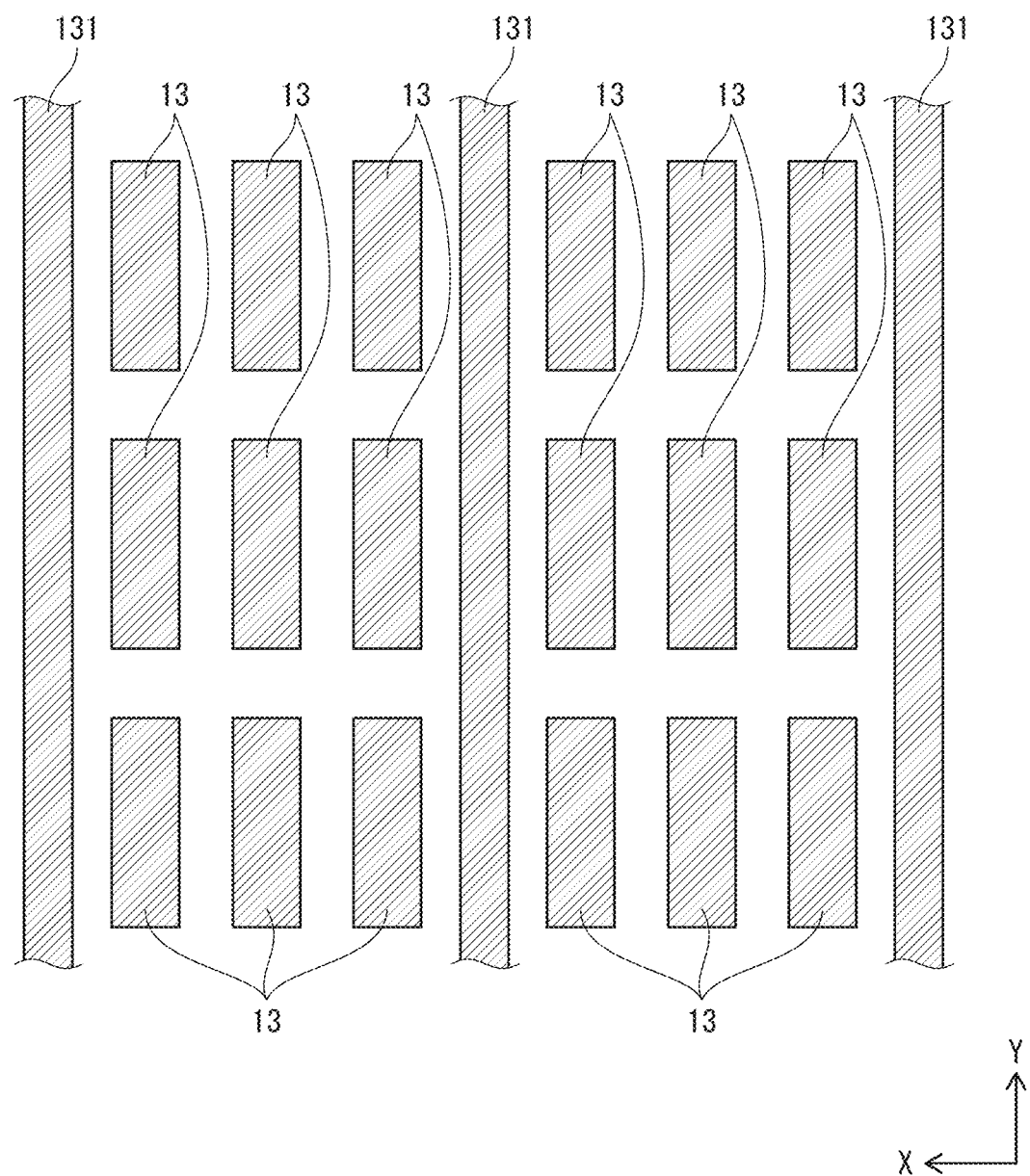
FIG. 4 is a plan view diagram illustrating a layout of pixel electrodes and auxiliary electrodes in the organic EL display panel illustrated in FIG. 2.

The following describes shapes and positions of the pixel electrodes 13 and the auxiliary electrodes 131 relative to each other. FIG. 4 is a plan view diagram illustrating a layout of the pixel electrodes 13 and the auxiliary electrodes 131.

As illustrated, according to at least one embodiment, the pixel electrodes 13 each have a rectangular shape in plan view, and the auxiliary electrodes 131 each have a line shape extending in the column direction (Y axis direction). The pixel electrodes 13 are arranged in a matrix along the row direction (X axis direction) and the column direction (Y axis direction).

Three Y axis direction columns of the pixel electrodes 13 are arranged between adjacent ones of the auxiliary electrodes 131. That is, the auxiliary electrodes 131 are arranged in parallel with columns of the pixel electrodes 13 every three columns. According to this arrangement of the auxiliary electrodes 131, and by electrically connecting the auxiliary electrodes 131 to the counter electrode 20, a stable voltage is applied to each pixel regardless of distance from the peripheral portion of the counter electrode 20, and luminance unevenness due to sheet resistance of the counter electrode 20 is unlikely to occur.

(5) Banks and Pixel Regulation Layers

Returning to FIG. 3, the banks 14 partition the pixel electrodes 13 corresponding to the sub-pixels above the substrate 11 into columns separated in the X direction (see FIG. 2), and each has a line bank shape extending in the Y direction between the sub-pixel columns CR, CG, CB arranged in the X direction.

An electrically insulative material is used for the banks 14. An example of an electrically insulative material is an insulative organic material (such as acrylic resin, polyimide resin, novolac resin, phenolic resin, or the like).

The banks (column banks) 14 function as structures for preventing applied ink of different colors from overflowing and mixing when the organic light-emitting layers 17 are formed by a wet process.

When using a resin material, a photosensitive material is advantageous from the viewpoint of workability. Photosensitivity may be positive or negative.

According to at least one embodiment, the banks 14 have an organic solvent resistance and heat resistance. In order to suppress overflow of ink, according to at least one embodiment, surfaces of the banks 14 have liquid repellency.

Where the pixel electrodes 13 are not present, a bottom surface of the banks 14 is in contact with the top surface of the interlayer insulating layer 12.

The pixel regulation layers (row banks) 141 are made of an electrically insulating material and cover end portions in the Y direction (FIG. 2) of the pixel electrodes 13 in each sub-pixel column, separating the pixel electrodes 13 from each other in the Y direction.

The pixel regulation layers 141 have excellent wettability with respect to ink. The organic light-emitting layers 17 in each of the sub-pixel columns CR, CG, CB are not partitioned by the pixel regulation layers 141, and flow of ink is not hindered by the pixel regulation layers 141 when forming the organic light-emitting layers 17. As a result, a liquid level of applied ink is leveled, and therefore film thickness of the organic light-emitting layers 17 in any given sub-pixel column can be made uniform.

According to the structure described above, the pixel regulation layers 141 improve electrical insulation between the pixel electrodes 13 in the Y direction while suppressing interruption of the organic light-emitting layers 17 within the sub-pixel columns CR, CG, CB, and improve electrical insulation between the pixel electrodes 13 and the counter electrode 20.

Examples of an electrically insulating material used for the pixel regulation layers 141 include an organic material used as the material of the banks 14, an inorganic material, or the like. According to at least one embodiment, surfaces of the pixel regulation layers 141 are lyophilic with respect to the ink used in forming the organic light-emitting layers 17, in order to facilitate ink spread.

(6) Hole injection layers

The hole injection layers 15 are disposed on the pixel electrodes 13 for the purpose of promoting injection of holes from the pixel electrodes 13 to the organic light-emitting layers 17. The hole injection layers 15 are made of an oxide of a metal such as silver (Ag), molybdenum (Mo), chromium (Cr), tungsten (W), nickel (Ni), iridium (Ir), or the like, or an electrically conductive polymer material such as poly(3,4-ethylenedioxythiophene) polystyrene sulfonate (PEDOT:PSS). According to at least one embodiment, the hole injection layers 15 are formed by a sputter process or a wet process.

Of the above, the hole injection layers 15 made of a metal oxide have a large work function and stably inject holes into the hole transport layers 16 or the organic light-emitting layers 17.

In a case of the hole injection layers 15 being made by a wet process, the hole injection layers 15 are not formed on the auxiliary electrodes 131.

(7) Hole Transport Layers

The hole transport layers 16 are disposed in openings 14a between the banks 14, and have a function of transporting holes injected from the hole injection layers 15 to the organic light-emitting layers 17. The hole transport layers 16 are made of a polymer compound such as polyfluorene, a polyfluorene derivative, polyarylamine, a polyarylamine derivative, or the like, and formed by a wet process.

The hole transport layers 16 are also not formed on the auxiliary electrodes 131.

(8) Organic Light-Emitting Layers

The organic light-emitting layers 17 are disposed in the openings 14a, and have a function of emitting light in RGB colors through recombination of holes and electrons. Where a distinction is made between light emission colors, the organic light-emitting layers 17 may be referred to as organic light-emitting layers 17(R), 17(G), 17(B).

Examples of a material of the organic light-emitting layers 17 include, a fluorescent substance such as an oxinoid compound, a perylene compound, a coumarin compound, an azacoumarin compound, an oxazole compound, an oxadiazole compound, a perinone compound, a pyrrolo-pyrrole compound, a naphthalene compound, an anthracene compound, a fluorene compound, a fluoranthene compound, a tetracene compound, a pyrene compound, a coronene compound, a quinolone compound and azaquinolone compound, a pyrazoline derivative and pyrazolone derivative, a rhodamine compound, a chrysene compound, a phenanthrene compound, a cyclopentadiene compound, a stilbene compound, a diphenylquinone compound, a styryl compound, a butadiene compound, a dicyanomethylene pyran compound, a dicyanomethylene thiopyran compound, a fluorescein compound, a pyrylium compound, thiapyrylium compound, a selenapyrylium compound, a telluropyrylium compound, an aromatic aldadiene compound, an oligophenylene compound, a thioxanthene compound, a cyanine compound, an acridine compound, a metal complex of an 8-hydroxyquinoline compound, a metal complex of a 2-bipyridine compound, a complex of a Schiff base and a group III metal, a metal complex of oxine, a rare earth metal complex, a phosphorescent metal complex, or the like.

The organic light-emitting layers 17 are not formed on the auxiliary electrodes 131.

(9) Intermediate Layer

The intermediate layer 18 is for preventing impurities inside or on a surface of the organic light-emitting layers 17, the hole transport layers 16, the hole injection layers 15, the banks 14, and the pixel regulation layers 141 from infiltrating to the functional layer 19 or the counter electrode 20. From a viewpoint of ease of manufacture, the intermediate layer 18 is common to a plurality of pixels and auxiliary electrode areas CE.

The intermediate layer 18 is made of a material able to block impurities, and more specifically a fluoride of a metal (hereinafter also referred to as "first metal") selected from alkali metals or alkaline earth metals, such as sodium fluoride (NaF), lithium fluoride (LiF), cesium fluoride (CsF), or the like.

According to at least one embodiment, NaF is used.

(10) Functional Layer

The functional layer 19 has a function of injecting and transporting electrons supplied from the counter electrode 20 towards the organic light-emitting layers 17. The functional layer 19 is made of an organic material, in particular an organic material having a property (hereinafter also referred to as an "electron transfer facilitation property") of electron transport, electron injection, or both electron transport and electron injection, doped with a rare earth metal. The rare earth metal (hereinafter also referred to as "second metal") dopant has a function of reducing the first metal fluoride in the intermediate layer 18 to break a bond between the first metal and fluorine. According to at least one embodiment, ytterbium (Yb) is used as the second metal.

Examples of the organic material (host material) having an electron transfer facilitating property are π electron low molecular weight organic materials such as an oxadiazole derivative (OXD), a triazole derivative (TAZ), a phenanthroline derivative (BCP, Bphen), and the like.

(11) Counter Electrode

The counter electrode 20 is made of a light-transmissive electrically conductive material and is disposed on the functional layer 19. The counter electrode 20 functions as an anode.

As the counter electrode 20, a metal thin film or a light-transmissive electrically conductive film such as ITO, IZO, aluminum zinc oxide (AZO), or the like can be used. According to at least one embodiment, in order to more effectively obtain an optical resonator structure, a metal thin film made of at least one of aluminum, magnesium, silver, aluminum-lithium alloy, magnesium-silver alloy, or the like is used as the material of the counter electrode 20. According to at least one embodiment, film thickness of the metal thin film is from 5 nm to 30 nm, in order to be partially reflective and partially light-transmissive (like a half mirror).

(12) Sealing Layer

The sealing layer 22 is provided to prevent organic layers such as the hole transport layers 16, the organic light-emitting layers 17 and the functional layer 19 from deteriorating due to exposure to external impurities.

The sealing layer 22 is made of a light-transmissive material such as silicon nitride (SiN), silicon oxynitride (SiON), or the like.

(13) Other Structure

Although not illustrated in FIG. 3, according to at least one embodiment, an antiglare polarizing plate or an upper substrate is bonded onto the sealing layer 22 by a light-transmissive adhesive. Further, according to at least one embodiment, a color filter substrate for correcting chromaticity of light emitted by each of the organic EL elements 2 is attached. As a result, the hole transport layers 16, the organic light-emitting layers 17, the functional layer 19, and the like can be further protected from external impurities.

3. Intermediate Layer, Functional Layer Material, Range of Film Thickness, and Functional Layer Dopant Concentration FIG. 5A is a diagram schematically illustrating a stack structure from the pixel electrodes (anode) 13 to the counter electrode (cathode) 20 in each of the organic EL elements 2 of the organic EL display panel 10, and FIG. 5B is a diagram schematically illustrating a stack structure from the auxiliary electrode 131 to the counter electrode 20 in a portion of the organic EL display panel 10 including the auxiliary electrode 131.

(1) Intermediate Layer

Figure 5A:
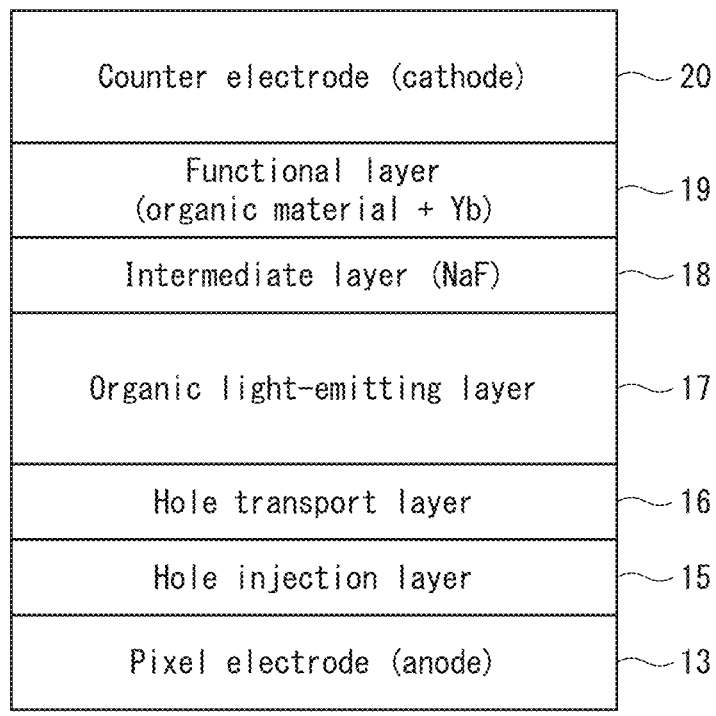
FIG. 5A is a schematic diagram illustrating a stacked structure of a portion of an organic EL element in the organic EL display panel.
Figure 5B:
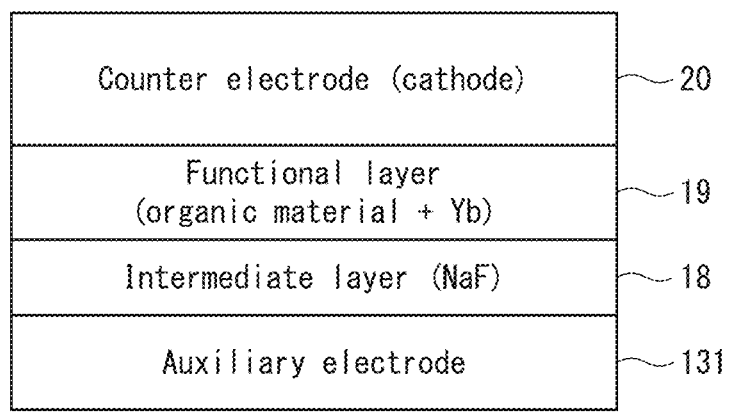
FIG. 5B is a schematic diagram illustrating a stacked structure of a portion of the organic EL display panel including an auxiliary electrode.

As illustrated in FIG. 5A, the intermediate layer 18 made of NaF and having a high blocking property against impurities is disposed on the organic light-emitting layers 17, and the functional layer 19 made of an organic material doped with Yb is disposed on the intermediate layers 18.

As illustrated in FIG. 3, the intermediate layer 18 covers both the top surfaces of the organic light-emitting layers 17 and the banks 14, and therefore even if at least one layer among the organic light-emitting layers 17, the hole injection layers 15, and the hole transport layers 17 is formed by a wet process such as printing, and impurities such as water remain therein, the impurities can be blocked from infiltrating into the functional layer 19.

Further, a portion of NaF is reduced by Yb in the functional layer 19 stacked thereon, and dissociated Na imparts an electron injection property to the organic light-emitting layers 17.

NaF of the intermediate layer 18 imparts an electron injection property to the organic light-emitting layers 17, has a property of blocking impurities, and film thickness of the intermediate layer 18 is preferably from 1 nm to 3 nm.

If film thickness is less than 1 nm, insufficient thickness means that the effects of imparting an electron injection property to the organic light-emitting layers 17 and blocking impurities from infiltrating to the functional layer 19 are insufficiently realized, and if film thickness is greater than 3 nm, the reducing action of the metal dopant in the functional layer 19 does not sufficiently act on an inside of the intermediate layer 18, and contact resistance becomes large, such that functionality of the auxiliary electrodes is insufficiently realized, and uneven luminance caused by sheet resistance of the counter electrode 20 cannot be eliminated.

(2) Functional Layer

Further, as described above, according to at least one embodiment, ytterbium (Yb), which is a rare earth metal different from conventionally-used barium (Ba), which is an alkaline earth metal, is adopted as the metal dopant of the functional layer 19.

Rare earth metals have a relatively low work function, and therefore have an excellent electron injection property by themselves, and a reducing property. Thus, a fluoride of an alkali metal or alkaline earth metal in the intermediate layer 18 is reduced and dissociated, an electron injection property of the alkali metal or alkaline earth metal can be realized, and a contribution to improvement of light emission efficiency is made.

Rare earth metals, in comparison with alkaline earth metals, also have an advantage of lower reactivity with impurities, and therefore even if impurities that cannot be fully blocked by the intermediate layer 18 or the counter electrode 20 infiltrate into the functional layer 19, the electron injection property is less likely to deteriorate. Thus, life of organic EL elements can be extended.

As a result, according to the structure of at least one embodiment, even when at least one of the hole injection layers 15, the hole transport layers 16, and the organic light-emitting layers 17 of the organic EL elements 2 is formed as an applied film applied by a wet process in order to reduce manufacturing cost, impurities contained in the applied film or infiltrating from outside are blocked, and deterioration of an electron injection property of the functional layer 19 is suppressed, thereby greatly increasing life of the organic EL elements 2.

Yb that is the metal dopant of the functional layer 19 has a property of excellent electron injection from the counter electrode 20 that is a cathode, and also has higher light transmission than Ba and the like, and therefore according to at least one embodiment, film thickness of the functional layer 19 is from 5 nm to 30 nm.

If film thickness is less than 5 nm, insufficient thickness means that NaF of the intermediate layer 18 is insufficiently reduced and insufficient electrons are not injected from the counter electrode 20, while if film thickness is greater than 30 nm, light transmission deteriorates, deteriorating light extraction efficiency, which carries a risk of hindering luminance efficiency.

The intermediate layer 18 simultaneously has two functions, one of blocking movement of impurities from a lower organic layer to the functional layer 19 and one of injecting electrons into the organic light-emitting layer 17, it is effective to stack the intermediate layer 18 directly on the organic light-emitting layers 17 and to have the functional layer 19 on and in contact with the intermediate layer 18.

(3) Yb Doping Concentration in Functional Layer

According to at least one embodiment, the doping concentration of Yb in the functional layer 19 is from 3 wt % to 40 wt %. If less than 3 wt %, a required electron injection property is not obtained, and if over 40 wt %, there is a risk of light transmission deteriorating, causing luminance efficiency to deteriorate.

When Ba is used as the metal dopant, as in a conventional case, it is considered desirable that doping concentration is from 5 wt % to 40 wt %. The electron injection properties of Yb and Ba are substantially equivalent, but a lower limit of doping concentration is smaller for Yb because Yb has a lower reactivity to impurities such as water than Ba, and therefore even if the doping concentration is lower, a certain level of electron injection property can be secured for a long time.

4. Significance of Selecting Yb from Rare Earth Metals

Rare earth metals tend to have a low work function and therefore an electron injection property, and also a standard reduction potential having a negative value (−2.19 V) and therefore a reducing property, and since the absolute value of this negative value of standard reduction potential is smaller than Ba (−2.92 V), a rare earth metal is that much more chemically stable, reactivity with water and the like is suppressed, and therefore life of the organic EL elements can be further extended.

In particular, Yb has the lowest work function (2.63 eV) among rare earth metals, has an excellent electron injection property, and also has a relatively large absolute value of the negative value of standard reduction potential, and therefore has an advantage of an excellent reduction property. As a result, a portion of NaF in the intermediate layer 18 can be dissociated and the electron injection property increased.

Further, Yb has a low boiling point (1196° C.) among rare earth metals, and is suitable for a vapor deposition process.

Figures 6A, 6B:
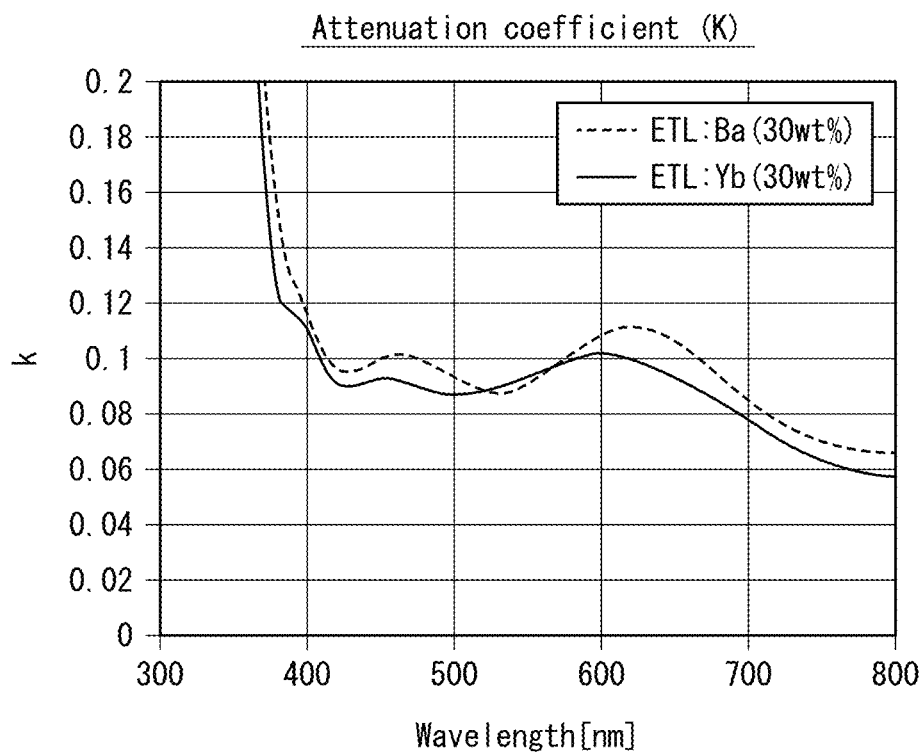
FIG. 6A is a graph illustrating a comparison of changes in attenuation coefficients of Ba and Yb with respect to changes in frequency.
FIG. 6B is a table showing peak wavelengths of RGB light emission colors, attenuation coefficients of Ba and Yb at each of these wavelengths, and attenuation coefficient ratios.

Further, when an attenuation coefficient of the functional layer 19 was measured experimentally, the results shown in the graph of FIG. 6A were obtained. In the graph, the horizontal axis shows light wavelength and the vertical axis shows magnitude of attenuation coefficient. The attenuation coefficient is dimensionless, but the larger the value, the worse the light transmission.

The solid line plot shows experimental results for a functional layer of an electron-transporting organic material doped to 30 wt % of Yb, and the dashed line plot shows experimental results for a functional layer of the same electron-transporting organic material doped to 30 wt % of Ba. For both samples, film thickness of the functional layer was the same.

As illustrated in the graph of FIG. 6A, the attenuation coefficient of the Yb doped functional layer is smaller than that of the Ba doped functional layer, except for in a wavelength range from about 530 nm to 570 nm.

FIG. 6B is a table illustrating a comparison between samples in which the metal dopant is Yb or Ba, comparing attenuation coefficients at target peak wavelengths at which a good color display images are obtained for each light emission color R, G, B of organic EL elements.

As illustrated in the table, at all of the target peak wavelengths for B, G, R (450 nm, 520 nm, 620 nm, respectively), the attenuation coefficient when Yb is the metal dopant is smaller than when Ba is the metal dopant, and the ratios of attenuation coefficients (Yb/Ba) are all less than 1, indicating superior light transmission when the metal dopant is Yb.

In particular, when the light emission color is R, the attenuation coefficient is reduced by 11% or more, and therefore light extraction efficiency is increased accordingly, and luminance efficiency is improved accordingly.

Based on the above studies, when using a rare earth metal as the metal dopant of the functional layer 19, in particular using Yb, resistance to water and the like is stronger and life is further extended compared to when the alkaline earth metal Ba is used as the metal dopant, and further, luminance efficiency is improved, and an effect of easy film formation by vapor deposition can be obtained.

5. Relationship Between Intermediate Layer Film Thickness and Functional Layer Yb Concentration and Contact Resistance Under heading 3, above, intermediate layer film thickness and functional layer Yb dopant concentration were considered from the viewpoint of luminance efficiency and life extension of the organic EL elements 2, but as described under the heading BACKGROUND, when trying to eliminate uneven luminance due to sheet resistance of the counter electrode 20, it is desirable to reduce contact resistance between the auxiliary electrodes 131 and the counter electrode 20 as much as possible.

Therefore the following is an examination of conditions under which contact resistance is good between the auxiliary electrodes 131 and the counter electrode 20.

As illustrated in FIG. 5B, according to at least one embodiment, the intermediate layer 18 and the functional layer 19 are disposed between the auxiliary electrode 131 and the counter electrode 20.

In a structure in which the intermediate layer 18 is made of NaF and the functional layer 19 is made of an organic material doped with Yb, there are primarily two methods for reducing contact resistance.

The first is a method of reducing an amount of NaF, which has an electrical insulation property, that is, reducing film thickness of the intermediate layer 18. The second is a method of increasing Yb dopant concentration in the functional layer 19 to reduce more NaF in the intermediate layer 18 and thereby release Na.

Here, 16 types of sample were prepared with different combinations of film thickness of the intermediate layer 18 (that is, amount of NaF) and Yb concentration in the functional layer 19, and a value of contact resistance between the auxiliary electrodes 131 and the contact electrode 20 was measured for each sample.

In this experiment, contact resistance between a first point on a flat portion of a contact surface of the functional layer 19 with the counter electrode 20 and a second point on a contact surface of the intermediate layers 18 with the auxiliary electrode 131 corresponding to the first point was measured by resistance measuring device, where the first point and the second point are on the same straight line perpendicular to the contact surfaces.

Configurations of measured samples and contact resistance measurement results are shown in the table of FIG. 7.

As shown in FIG. 7, the Yb doping concentration in the functional layer 19 (hereinafter also referred to as "Yb concentration") is 10 wt % in samples 1-4, 20 wt % in samples 5-8, 30 wt % in samples 9-12, and 40 wt % in samples in samples 13-16.

Film thickness of the intermediate layer 18 is 1 nm in samples 1, 5, 9, 13, 2 nm in samples 2, 6, 10, 14, 3 nm in samples 3, 7, 11, 15, and 4 nm in samples 4, 8, 12, 16.

Samples 1-4, 7, and 8 could not be measured because the contact resistances values exceeded measurement limits of the measuring device.

According to the findings of the inventors of the present disclosure, when the value of the contact resistance is 5.0E+05Ω or less, power can be supplied through the auxiliary electrodes 131, which have low resistance and high responsiveness, instead of the counter electrode 20, which has high resistance. That is, sheet resistance of the counter electrode 20 is reduced, and as a result, uneven luminance is eliminated.

In the table of FIG. 7, contact resistance values of 5.0E+05Ω or less are those surrounded by a thick frame, and are samples 5, 9, 10, 13, 14, and 15. Accordingly, these six samples were judged suitable for practical use (satisfactory), and the other samples were judged unsuitable for practical use (unsatisfactory).

Figure 8:
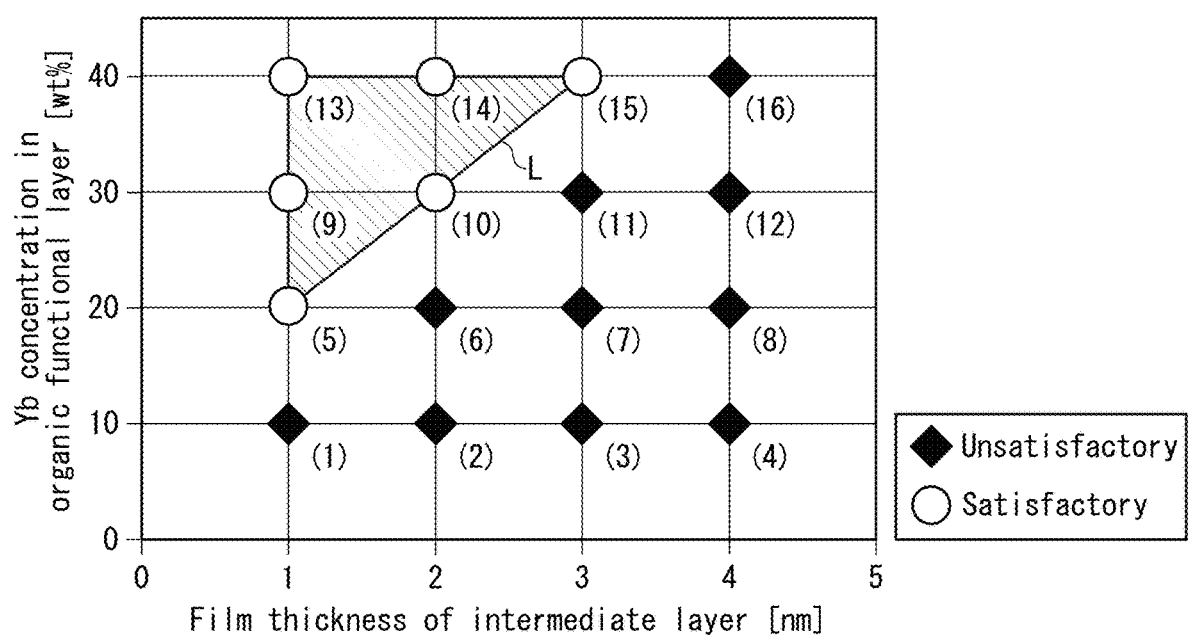
FIG. 8 is a graph in which the measurement results of FIG. 7 are plotted.

FIG. 8 is a diagram in which the results of the above judgment are plotted on a graph, with the Yb concentration in percentage by weight in the functional layer 19 on the vertical axis (Y axis) and the film thickness in nanometers of the intermediate layer 18 on the horizontal axis (X axis).

Here, the white circles (○) indicate samples with a contact resistance value judged to be suitable for practical use (satisfactory) and the black diamonds (♦) indicate samples with a contact resistance value judged to be unsuitable for practical use (unsatisfactory). Further, numbers in parentheses indicate the sample numbers.

As illustrated in FIG. 8, only six samples, 5, 9, 10, 13, 14, and 15 were judged to have contact resistance values suitable for practical use.

Accordingly, if a sample is located within an area that includes the six points plotted for the six samples (an area shaded with diagonal lines in FIG. 8), a contact resistance value of the sample is considered to be suitable for practical use.

Here, a straight line L connecting samples 5, 10, 15 is expressed by y=10x+10. Accordingly, when y is Yb concentration in percentage by weight of the functional layer 19 and x is film thickness in nanometers of the intermediate layer 18, the area satisfies the relationships $1 \le x \le 3$, $20 \le y \le 40$, and $y \ge 10x+10$. Hereinafter, this area is also referred to as a "practical suitability area".

By setting the film thickness of the intermediate layer 18 and the doping concentration of the functional layer 19 within the range indicated by the practical suitability area, luminance efficiency can be improved and life extended for each organic EL element, and the organic EL display panel 10 as a whole can effectively suppress uneven luminance caused by sheet resistance of the counter electrode 20.

6. Organic EL Display Panel Manufacturing Method

Figure 9:
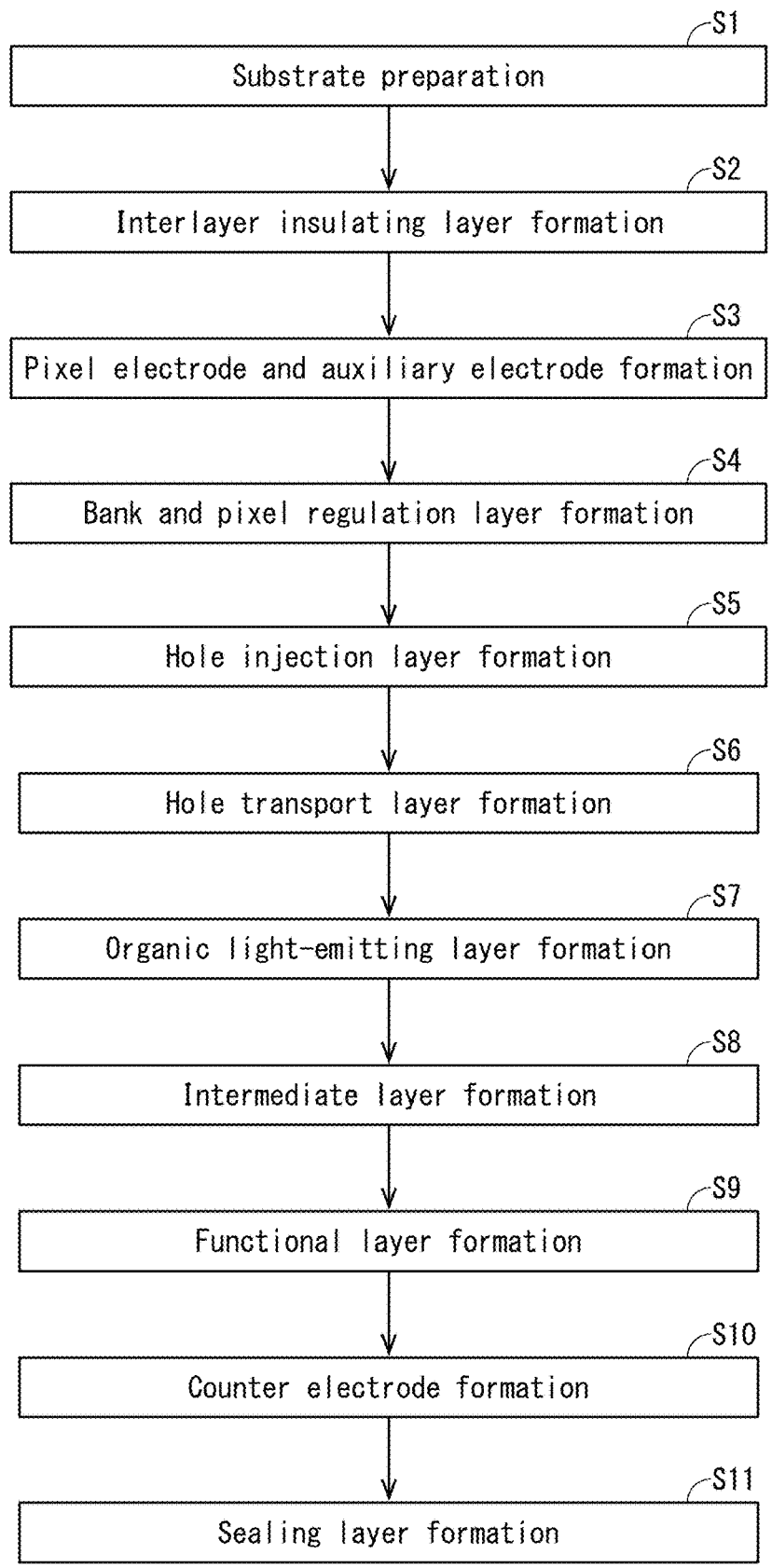
FIG. 9 is a process diagram illustrating steps in manufacturing an organic EL display panel according to at least one embodiment.
Figure 13A:
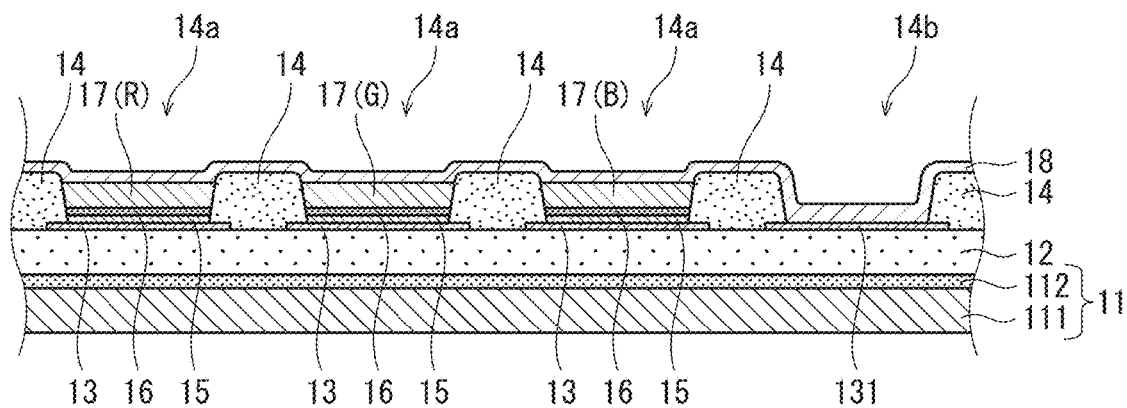
FIG. 13A to FIG. 13C are cross-section diagrams schematically illustrating steps in manufacture of an organic EL display panel, continuing from FIG. 12B.
Figure 13B:
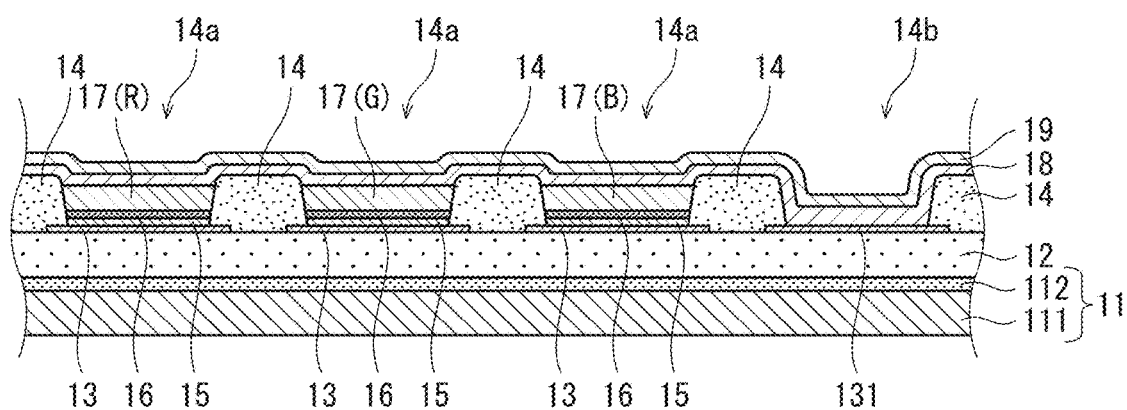
Figure 13C:
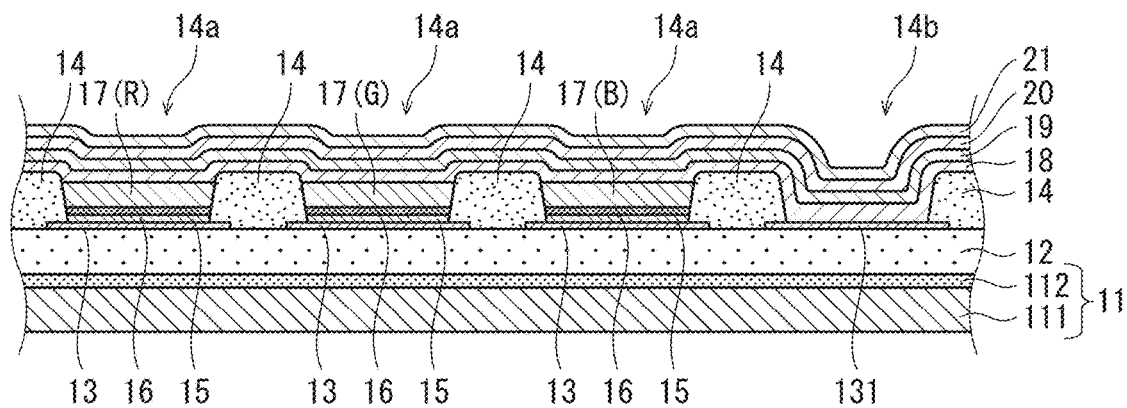

The following describes an example of a method of manufacturing the organic EL display panel 10, with reference to FIG. 9 through to FIG. 13C.

Figure 10A:
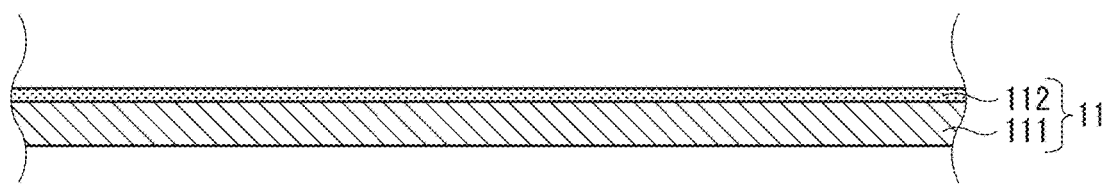
FIG. 10A to FIG. 10C are cross-section diagrams schematically illustrating steps in manufacture of an organic EL display panel according to at least one embodiment.

FIG. 9 is a flowchart illustrating steps in the manufacture of the organic EL display panel 10, and FIG. 10A through to FIG. 13C are cross-section diagrams schematically illustrating the manufacturing steps.

(1) Substrate Preparation (Step S1 in FIG. 9)

First, as illustrated in FIG. 10A, the TFT layer 112 is formed on the base 111 to prepare the substrate 11. The TFT layer 112 can be formed by a known TFT manufacturing method.

(2) Interlayer Insulating Layer Formation (Step S2 in FIG. 9)

Figure 10B:
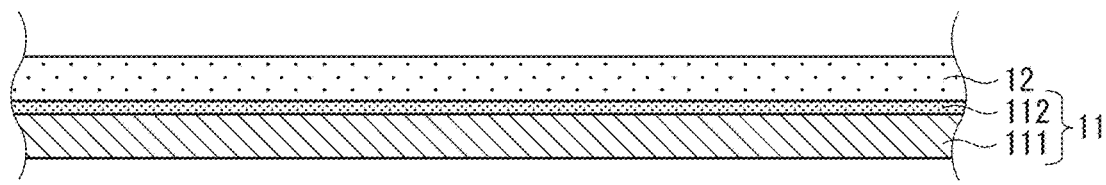

Next, as illustrated in FIG. 10B, the interlayer insulating layer 12 is formed on the substrate 11.

Specifically, a resin material having a defined fluidity is applied across the top surface of the substrate 11 by, for example, a die coating method, so as to fill irregularities in the top surface of the substrate 11 due to the TFT layer 112, then baked. Thus, the top surface of the interlayer insulating layer 12 is planarized to conform to the top surface of the base 111.

Further, a dry etching method is applied to positions of the interlayer insulating layer 12 above TFT elements, for example source electrodes, to form contact holes (not illustrated). The contact holes are formed by patterning or the like such that surfaces of the source electrodes of the TFT elements are exposed at bottoms of the contact holes.

Next, a connecting electrode layer is formed along inner walls of the contact holes. Top portions of the connecting electrode layer are disposed on the interlayer insulating layer 12. According to at least one embodiment, the connecting electrode layers are formed by a sputtering method to form a metal film, followed by patterning by using a photolithography method or wet etching method.

(3) Pixel Electrodes and Auxiliary Electrodes Formation (Step S3 in FIG. 9)

Figure 10C:
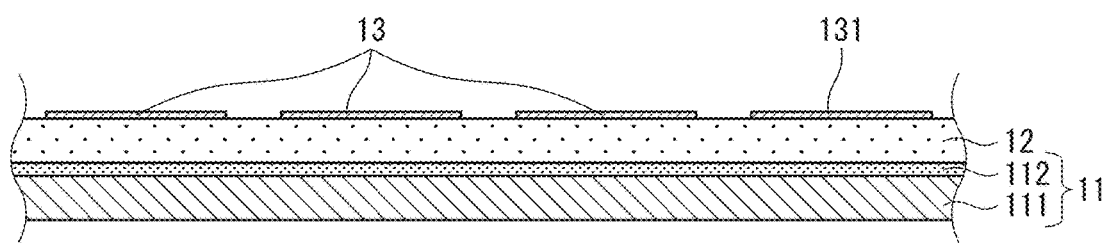

Next, as illustrated in FIG. 10C, the pixel electrodes 13 and the auxiliary electrodes 131 are formed on the interlayer insulating layer 12.

The pixel electrodes 13 and the auxiliary electrodes 131 are formed by first forming a metal layer having a film thickness of about 150 nm by vacuum deposition or sputtering of a metal such as aluminum, then patterning by etching.

According to this patterning, the pixel electrodes 13 are formed to correspond one-to-one with sub-pixels, and the auxiliary electrodes are formed to have a line shape extending in the column direction (see FIG. 4).

By forming the pixel electrodes 13 and the auxiliary electrodes 131 simultaneously on the interlayer insulating layer 12 with the same metal material, the manufacturing process is simplified and costs can be reduced.

(4) Banks and Pixel Regulation Layers Formation (Step S4 in FIG. 9)

Next, the banks 14 and the pixel regulation layers 141 are formed.

According to at least one embodiment, the pixel regulation layers 141 and the banks 14 are formed in separate processes.

(4-1) Pixel Regulation Layers Formation

First, in order to partition the pixel electrode columns in the Y direction (FIG. 2) into sub-pixels, the pixel regulation layers 141 are formed extending in the X direction.

Figure 11A:
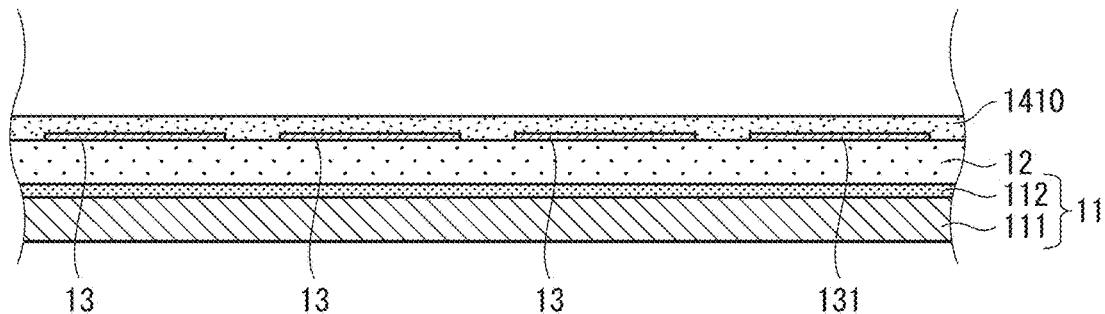
FIG. 11A to FIG. 11D are cross-section diagrams schematically illustrating steps in manufacture of an organic EL display panel, continuing from FIG. 10C.

As illustrated in FIG. 11A, a photosensitive resin material used as a material of the pixel regulation layers 141 is uniformly applied onto the interlayer insulating layer 12 on which the pixel electrodes 13 and the auxiliary electrodes 131 are formed, and after drying, a pixel regulation layer material layer 1410 having a film thickness that will result in a target height of the pixel regulation layers 141 is formed.

As a specific example of an application method, according to at least one embodiment, a wet method such as a die coating method, a slit coating method, a spin coating method, or the like is used. After application, according to at least one embodiment, vacuum drying and low temperature heat drying (pre-baking) at about 60° C. to 120° C. are performed to remove an unnecessary solvent and fix the pixel regulation layer material layer 1410 to the interlayer insulating layer 12.

A photolithography method is then used to pattern the pixel regulation layer material layer 1410.

For example, according to at least one embodiment, the pixel regulation layer material layer 1410 has positive photosensitivity, portions that are to remain as the pixel regulation layers 141 are shielded from light, and portions to be removed are exposed to light through light-transmissive areas of a photomask (not illustrated).

Next, the pixel regulation layers 141 can be formed by developing and removing the exposed portions of the pixel regulation layer material layer 1410. As a specific developing method, an example is to immerse the substrate 11 in a developing solution such as an organic solvent or alkaline solution that dissolves portions of the pixel regulation layer material layer 1410 that have been exposed to light, then immerse the substrate 11 in a rinsing liquid such as pure water to wash the substrate 11.

Figure 11B:
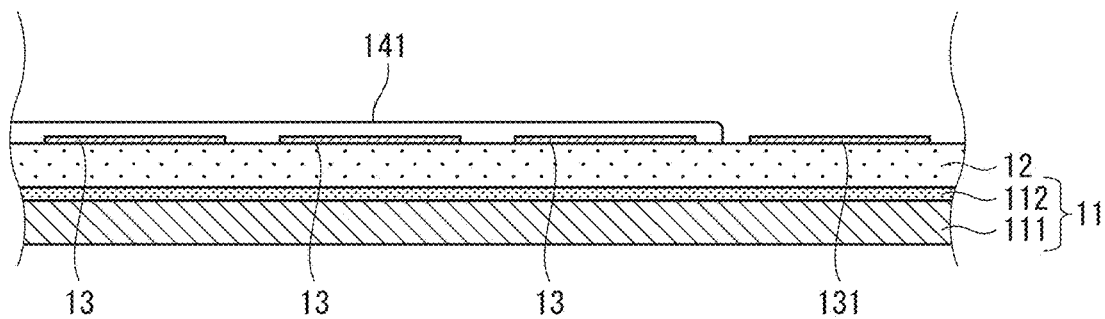

Then, by baking (post-baking) at a defined temperature, the pixel regulation layers 141 extending in the X direction can be formed on the interlayer insulating layer 12 (FIG. 11B).

Note that the pixel regulation layers 141 are not formed in an auxiliary electrode formation area where the auxiliary electrodes 131 are disposed.

(4-2) Banks Formation

Next, the banks 14 extending in the Y direction are formed in a similar way to the pixel regulation layers 141.

Figure 11C:
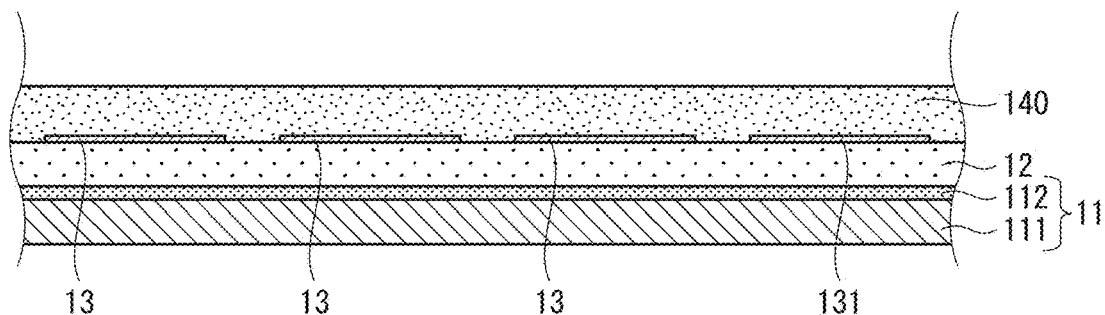
Figure 11D:
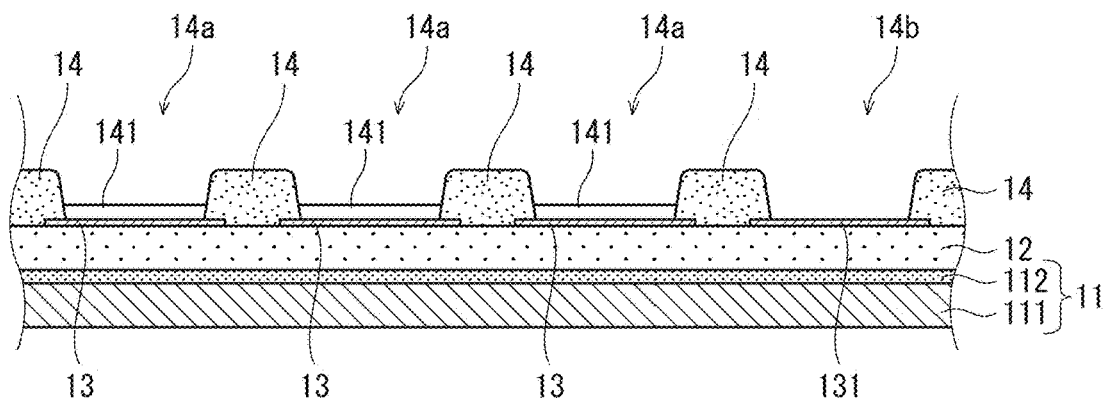

That is, a bank resin material is applied on the interlayer insulating layer 12 on which the pixel electrodes 13, the auxiliary electrodes 131, and the pixel regulation layers 141 are formed, by using a die coating method or the like, and after drying, a bank material layer 140 is formed having a film thickness that will result in a target height of the banks 14 is formed (FIG. 11C), then a photolithography method is used to pattern the bank material layer 140 such that the banks 14 extend in the Y direction, then baking at a defined temperature forms the banks 14 (FIG. 11D).

The above description is of the material layers of the pixel regulation layers 141 and the banks 14 being formed by wet processes and patterned, but according to at least one embodiment one or both of the material layers are formed by a dry process, and a photolithography method and an etching method is used for patterning.

Further, in forming the banks 14, according to at least one embodiment, surfaces of the banks 14 are further surface treated with a defined alkaline solution, water, an organic solvent, or the like, or subjected to plasma treatment. This is done for the purpose of adjusting a contact angle of the banks 14 with respect to ink (solution) subsequently applied into the openings 14a, or for the purpose of imparting water repellency to the surfaces.

(5) Hole Injection Layers Formation (Step S5 in FIG. 9)

Next, ink including constituent material of the hole injection layers is ejected from nozzles 3011 of an application head 301 of a printing device into the openings 14a defined by the banks 14, forming the hole injection layers 15 by a wet process. According to at least one embodiment, ink is not applied onto the auxiliary electrodes 131 so that the hole injection layers 15 are not formed thereon. This is in order to reduced the number of layers between the auxiliary electrodes 131 and the counter electrode 20, and thereby reduce contact resistance as much as possible.

However, as long as film thickness and material of the hole injection layers 15 are selected so that contact resistance between the auxiliary electrodes 131 and the counter electrode 20 is within the threshold value described above even when the hole injection layers 15 are formed on the auxiliary electrodes 131, the hole injection layers 15 may be formed on the auxiliary electrodes 131.

(6) Hole Transport Layers Formation (Step S6 in FIG. 9)

Next, ink including constituent material of the hole transport layers 16 is ejected from the nozzles 3011 of the application head 301 of the printing device to be applied onto the hole injection layers 15 in the openings 14a (printing method), then dried to form the hole transport layers 16. In this case also, the ink of the hole transport layers 16 is applied so as to extend along the Y direction (FIG. 2) above the pixel electrode columns, but not to openings 14b above the auxiliary electrodes 131.

Figure 12A:
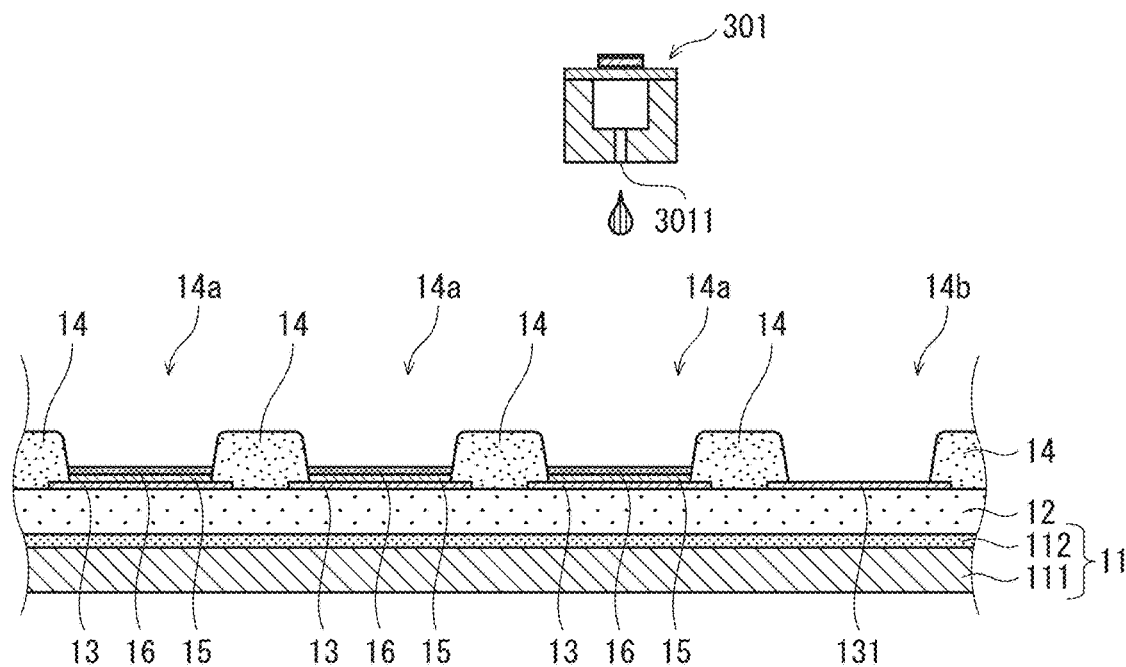
FIG. 12A and FIG. 12B are cross-section diagrams schematically illustrating steps in manufacture of an organic EL display panel, continuing from FIG. 11D.

FIG. 12A illustrates a state in which the hole transport layers 16 are being formed after the hole injection layers 15 are formed.

(7) Organic Light-Emitting Layers Formation (Step S7 in FIG. 9)

Next, the organic light-emitting layers 17 are formed above the hole transport layers 16.

Figure 12B:
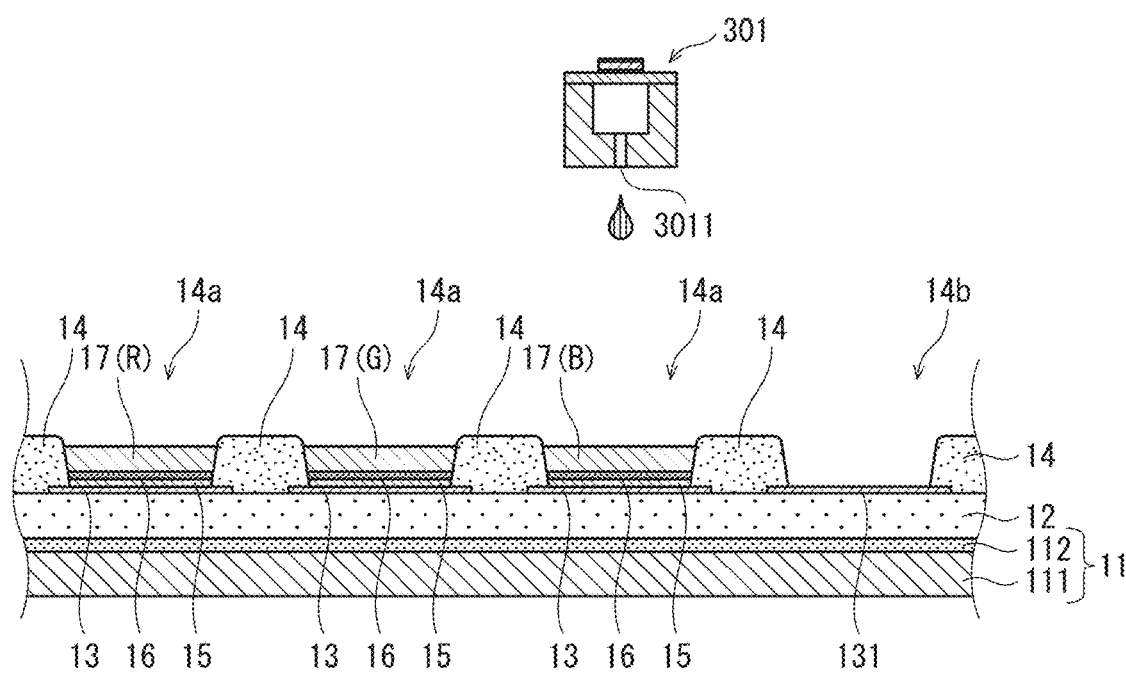

More specifically, as illustrated in FIG. 12B, inks each including a light-emitting material of a different light emission color are sequentially ejected from the nozzles 3011 of the application head 301 of the printing device to be applied onto the hole transport layers 16 in the openings 14a. At this time, ink is continuously applied even above the pixel regulation layers 141. As a result, ink can flow along the Y direction, liquid levels are levelled, uneven application of ink is eliminated, and film thicknesses of each of the organic light-emitting layers 17 in the same sub-pixel column can be made uniform.

After ink is applied, the substrate 11 is conveyed into a vacuum drying chamber and heated in a vacuum environment to evaporate organic solvent in the ink. In this way, the organic light-emitting material layers 17 are formed.

(8) Intermediate Layer Formation (Step S8 in FIG. 9)

Next, as illustrated in FIG. 13A, the intermediate layer 18 is formed on the organic light-emitting layers 17, the banks 14, and the auxiliary electrodes 131 as a single continuous layer. The intermediate layer 18 is formed by vapor deposition of NaF.

(9) Functional Layer Formation (Step S9 in FIG. 9)

Next, as illustrated in FIG. 13B, the functional layer 19 is formed on the intermediate layer 18. The functional layer 19 is formed, for example, by using a co-deposition method to form a film of an electron transporting organic material and Yb as a metal dopant across all sub-pixels.

(10) Counter Electrode Formation (Step S10 in FIG. 9)

Next, the counter electrode 20 common to each sub-pixel is formed on the functional layer 19. According to at least one embodiment, the counter electrode 20 is formed as a film of silver, aluminum, or the like by a sputtering method or a vacuum deposition method.

(11) Sealing Layer Formation (Step S11 in FIG. 9)

Next, the sealing layer 21 is formed on the counter electrode 20. The sealing layer 21 is formed by forming a film of SiON, SiN, or the like by a sputtering method, a chemical vapor deposition (CVD) method, or the like.

By the above process, the organic EL display panel 10 is completed. In the intermediate layer formation and the functional layer formation, Yb concentration in the functional layer 19 and film thickness of the intermediate layer 18 are adjusted to fall within the practical suitability area.

Review of Embodiment

As described above, according to the structure of the organic EL display panel 10 pertaining to at least one embodiment, life of the organic EL display panel 10 is further extended and an improvement in luminance efficiency can be expected due to the Yb doping in the functional layer 19.

Further, Yb concentration in the functional layer 19 and film thickness of the intermediate layer 18 are adjusted to fall within the practical suitability area, and therefore a value of contact resistance is within a practical suitability range, variation in voltage applied to each pixel is suppressed, and uneven luminance can be suppressed.

Here, the practical suitability area is an area that satisfies the relationships $1 \leq x \leq 3$, $20 \leq y \leq 40$, and $y \geq 10x+10$, where y is Yb concentration in percentage by weight of the functional layer 19 and x is film thickness in nanometers of the intermediate layer 18.

Modifications

Although embodiments of the organic EL display panel and the manufacturing method according to the present disclosure have been described above, the present disclosure is not limited to the above description aside from the description of essential characteristic features. The following describes modifications as further embodiments of the present disclosure.

Figure 18:
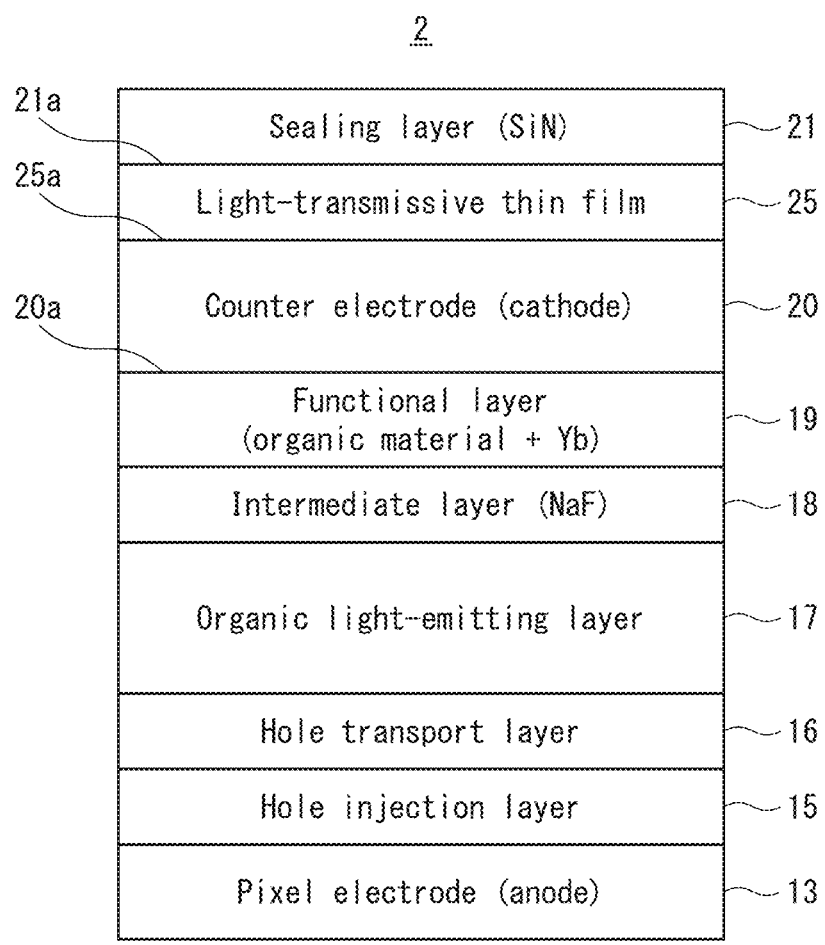
FIG. 18 is a schematic diagram illustrating a stack structure of a modification of an organic EL element according to at least one embodiment.

In drawings illustrating stack structures of organic EL elements introduced below, stack structures from the pixel electrodes 13 to the counter electrode 20 are illustrated, and the sealing layer 21 is omitted. FIG. 18 is an exception to this.

(1) Functional Layer Structure Modifications

According to at least one embodiment, the functional layer 19 is a single layer and the Yb doping concentration is uniform, but the following configurations may be used.

Figure 14:
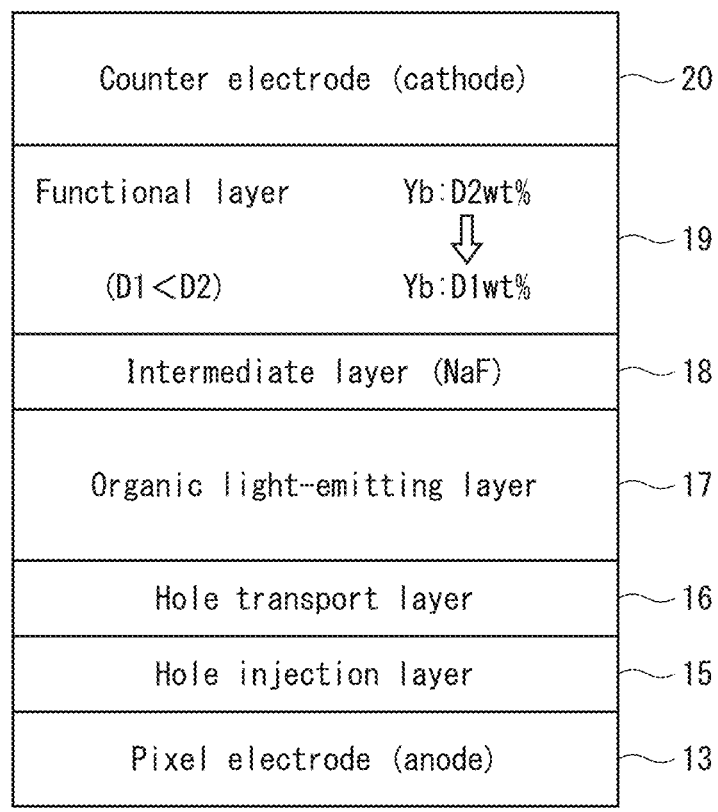
FIG. 14 is a schematic diagram illustrating a stack structure pertaining to Modification 1 of a functional layer of an organic EL element according to at least one embodiment.

(1-1) Functional Layer Remains Single Layer Structure, Yb Concentration Gradient in Film Thickness Direction FIG. 14 is a schematic diagram illustrating a stack structure of the organic EL element 2 according to Modification 1.

As illustrated, the Yb doping concentration in the functional layer 19 is D2 wt % on a side in contact with the counter electrode 20, and doping concentration decreases as distance to the intermediate layer 18 decreases. The doping concentration of D1 wt % at a side in contact with the intermediate layer 18 is such that D1<D2.

This continuous change in Yb content of the functional layer 19 means that a weak reducing property acts on the intermediate layer 18, appropriately limiting electron injection facilitation such that the function of the NaF of the intermediate layer 18 to block impurities is effectively expressed, suppressing infiltration of impurities into the functional layer 19, while light transmittance is prevented from being reduced more than necessary by an increase in Yb dopant. Further, by increasing cathode-side concentration, electron injection from a cathode side to the functional layer can be improved, and infiltration of impurities from outside can be prevented to further extend life of an organic EL element.

Thus, an organic EL element can be provided that has a higher luminance efficiency and longer life.

As a method of generating a gradual gradient of Yb concentration, an example is to use a co-deposition method in which a temperature of an electric furnace for heating Yb and a temperature of an electric furnace for heating organic material are each controlled to reduce a deposition rate of Yb relative to a deposition rate of the organic material.

Even in the case of this modification, values of both doping concentrations D1 and D2 and film thickness of the intermediate layer 18 are set to be within the range of the practical suitability area.

(1-2) Functional Layer as Two-Layer Structure

Figure 15:
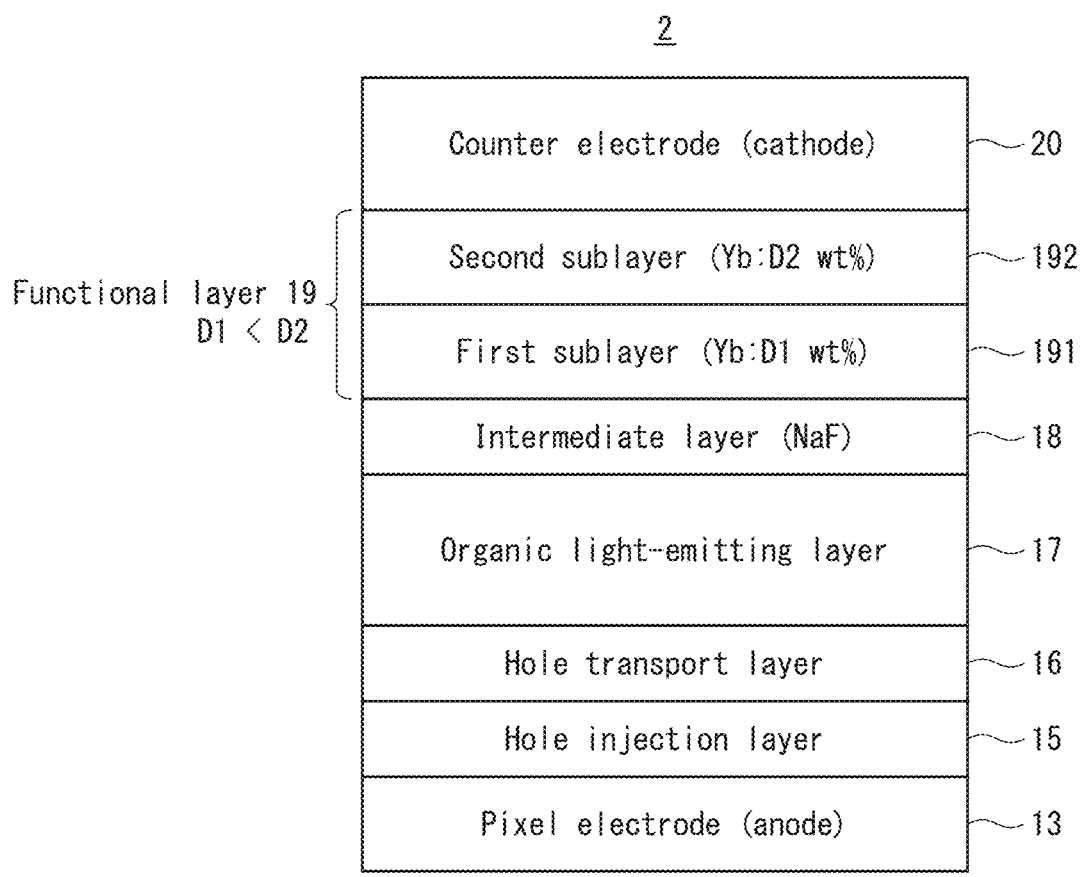
FIG. 15 is a schematic diagram illustrating a stack structure pertaining to Modification 2 of a functional layer of an organic EL element according to at least one embodiment.

FIG. 15 is a schematic diagram illustrating a stack structure of the organic EL element 2 according to Modification 2.

As illustrated, the functional layer 19 has a two-layer structure of a first sublayer 191 and a second sublayer 192, where Yb doping concentration of the second sublayer 192 (D2 wt %) is higher than Yb doping concentration of the first sublayer 191 (D1 wt %) (D1<D2).

Depending on the manufacturing method, an interface between the first sublayer 191 and the second sublayer 192 might not always be clear (for example, in the vicinity of the presumed interface, where the doping concentration D2 wt % of the second sublayer 192 decreases and approaches the doping concentration D1 wt % of the first sublayer 191). In such a case, the doping concentration D2 up to 80% concentration, for example, is considered to be the second sublayer 192, and a remainder as the first sublayer 191.

Similarly to the modification described under (1-1) above, this modification can be expected to improve luminance efficiency and extend service life. Further, values of both doping concentrations D1 and D2 and film thickness of the intermediate layer 18 are preferably set to be within the range of the practical suitability area.

(1-3) Functional Layer as Three-Layer Structure

Figure 16:
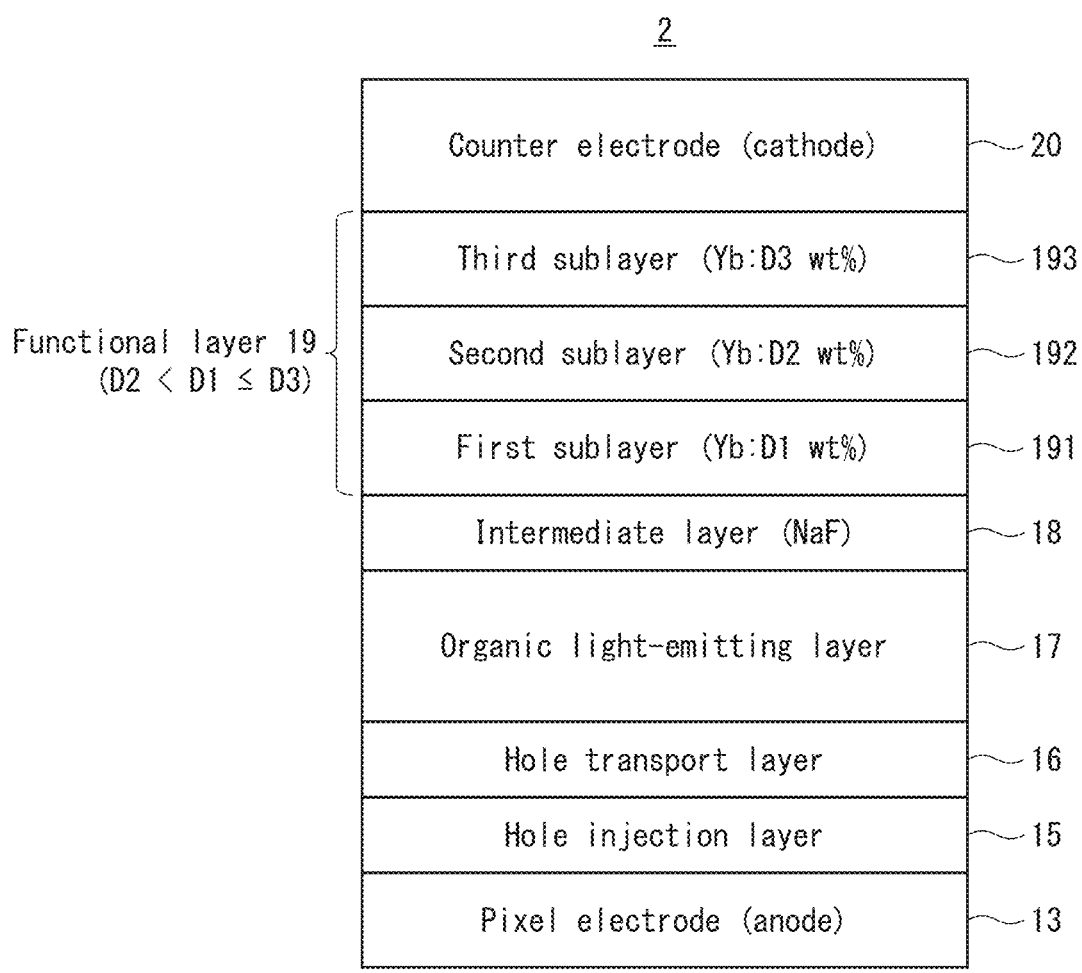
FIG. 16 is a schematic diagram illustrating a stack structure pertaining to Modification 3 of a functional layer of an organic EL element according to at least one embodiment.

FIG. 16 is a schematic diagram illustrating a stack structure of the organic EL element 2 according to Modification 3.

As illustrated, the functional layer 19 has a three-layer structure of the first sublayer 191, the second sublayer 192, and a third sublayer 193, and when the Yb doping concentrations thereof are D1 wt %, D2 wt %, and D3 wt %, respectively, the relationship $D2<D1 \leq D3$ is satisfied.

In this modification also, interfaces between the first sublayer 191, the second sublayer 192, and the third sublayer 193 might not always be clear, but judgment is made in same way as described under (1-2), above.

According to this modification, the dopant concentration of the third sublayer 193 on the counter electrode 20 side is higher than that of the first sublayer 191 on the intermediate layer 18 side, so this structure achieve the same effects as the modifications described above. Further, the dopant concentration of the second sublayer 192 between the first sublayer 191 and the third sublayer 193 is set to be lowest, and therefore light transmission is not decreased any more than necessary by an increase in Yb dopant. The first sublayer 191 makes it possible to improve electron injection towards the light-emitting layer while the NaF in the intermediate layer exhibits a property of blocking impurities.

Further, by increasing concentration of the third sublayer 193, electron injection from the cathode side towards the light-emitting layer can be improved, and entry of impurities from outside can be prevented to further extend life of an organic EL element.

Even in the case of this modification, values of doping concentrations D1, D2, and D3 and film thickness of the intermediate layer 18 are preferably set to be within the range of the practical suitability area.

(2) Optical Resonator Structure (2-1) In order to further improve luminance efficiency, an optical resonator structure can be used.

Figure 17:
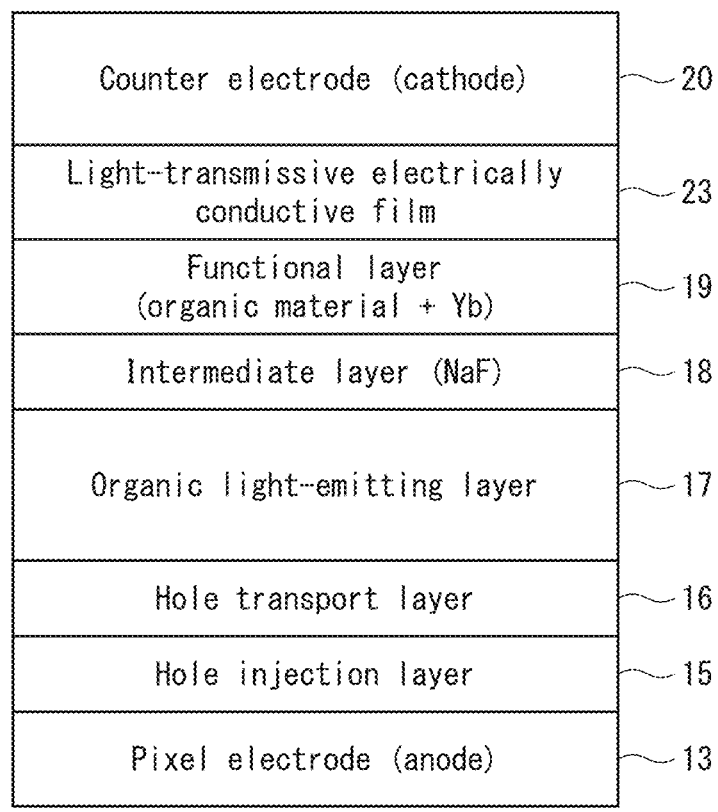
FIG. 17 is a schematic diagram illustrating a stack structure of a modification of an organic EL element according to at least one embodiment.

FIG. 17 is a schematic diagram illustrating a stack structure of the organic EL element 2 according to a modification.

As illustrated, a light-transmissive electrically conductive film 23 have a defined film thickness is disposed between the functional layer 19 and the counter electrode 20. The light-transmissive electrically conductive film 23 is formed by a magnetron sputtering method or the like applied to ITO, IZO, or the like.

By interposing the light-transmissive electrically conductive film 23, the counter electrode 20 and the light-transmissive electrically conductive film 23 together function as a cathode, and a combined sheet resistance is lowered, which contributes to prevention of luminance unevenness due to voltage drop. Further, ITO and IZO are highly light-transmissive, and therefore a relatively large film thickness can be adopted, and this can be used for adjusting optical path lengths in an optical resonator structure.

According to at least one embodiment, film thickness of the light-transmissive electrically conductive film 23 is 15 nm or greater. Film thickness of the light-transmissive electrically conductive film 23 is preferably 40 nm or greater. By setting the film thickness of the light-transmissive electrically conductive film 23 to 15 nm or more, cavity adjustment (film thickness adjustment for the optical resonator structure) can be effectively performed to achieve high efficiency.

The optical resonator structure is formed between an interface between the pixel electrodes 13 and the hole injection layers 15 and an interface between the counter electrode 20 and the light-transmissive electrically conductive film 23. In particular, in order to construct a secondary cavity, adjustment of optical length is important between a light emission position in the organic light-emitting layers 17 (for example, an interface between the organic light-emitting layers 17 and the hole transport layers 16) and a reflecting surface of the counter electrode (the interface between the counter electrode 20 and the light-transmissive electrically conductive film 23), and this can be achieved by adjusting the film thickness of the light-transmissive electrically conductive film 23 as described above.

As described above, Yb does not easily deteriorate due to reaction with impurities such as water, and therefore an amount of Yb dopant in the functional layer 19 can be minimized, and as a result, light transmission is high and an allowable range of film thickness thereof is also wide, which in combination with the light-transmissive electrically conductive film 23 increases the range, and a degree of freedom in designing the optical resonator structure is further increased.

Further, even when an ITO film or IZO film is formed by a sputtering method, the functional layer 19 can alleviate sputtering damage so that the organic light-emitting layers are protected, and organic EL elements can be obtained in which luminance efficiency is good, and life is not shortened.

According to this modification, the counter electrode 20 and the light-transmissive electrically conductive film 23 can be regarded in combination as a cathode (broadly speaking, a counter electrode), and therefore it does not matter if the light-transmissive electrically conductive film 23 is also present on the functional layer 19 above the auxiliary electrode 131.

(2-2) FIG. 18 is a schematic diagram illustrating a stack structure of the organic EL element 2 according to a modification.

As illustrated, this modification includes a light-transmissive thin film 25 outside of the counter electrode 20 (opposite side to the organic light-emitting layer 17).

In general, it is known that when a plurality of light-transmissive thin films having different refractive indices are stacked, a phenomenon occurs that a portion of light incident on the interfaces between light-transmissive thin films is reflected.

According to this modification, for example, the counter electrode 20 is Ag (refractive index 0.05), the light-transmissive thin film 25 is IZO (refractive index 2.05), and the sealing layer 21 is SiN (refractive index 1.85). As a result, in addition to an interface 20a between the counter electrode 20 and the functional layer 19, an interface 25a between the counter electrode 20 and the light-transmissive thin film 25, and an interface 21a between the light-transmissive thin film 25 and the sealing layer 21 become reflective surfaces.

Thus, a plurality of cavities (optical resonator structures) having different optical distances (resonance lengths) are formed between each interface and the reflective surface of the pixel electrode 13, each cavity generates a spectrum of light having a different peak wavelength, and a spectrum of light having a peak wavelength obtained by combining the spectra is output from the organic EL element 2.

Accordingly, an effect can be obtained of fine adjustment of chromaticity of output light by adjusting refractive indices and film thicknesses of each layer of the light-transmissive thin film 25 and the counter electrode 20. Such a structure is effective when ideal peak wavelengths of B, R, or G cannot be obtained due to the stack structure from the pixel electrode 2 to the counter electrode 20 in the organic EL element 2 and film thickness limits, allowing correction of peak wavelengths to ideal wavelength ranges.

By adjusting these film thicknesses, color purity can be improved for each light emission color R, G, and B.

Further, according to at least one embodiment, the light-transmissive thin film 25 is made of an IZO film, which is a light-transmissive electrically conductive film, in direct contact with the counter electrode 20, and therefore a voltage drop due to sheet resistance of the counter electrode 20 is reduced. Even if the organic EL display panel 10 is made larger, the voltage drop in the center of the screen can be suppressed and a better image quality can be obtained. According to at least one the light-transmissive thin film 25 is another light-transmissive electrically conductive film such as an ITO film.

(3) Intermediate Layer, Functional Layer Metal Dopant (3-1) Material of the intermediate layer 18 is not limited to NaF, and may be a fluoride of a metal (first metal) selected from the group consisting of alkali metals and alkaline earth metals. Fluorides of these metals all have properties in common of high light transmittance, resistance to transmission of impurities such as water, and reduced metals thereof facilitate electron injection.

Fluorides of alkali metals and alkaline earth metals are often poorly soluble, but NaF is soluble so that an NaF layer has an effect of absorbing and trapping water from a lower layer inside, such that water can be prevented from remaining in the lower layer. These functions are also thought to contribute to prevention of deterioration of layer functions, which is why NaF is considered to be superior to fluorides of other metals.

(3-2) According to at least one embodiment, Yb is used as the metal dopant of the functional layer, but other rare earth metals may be used. Other rare earth metals have many similarities to Yb such as a low work function, light-transmission, liquid resistance, and a reducing property.

(4) Other Modifications of Stack Structure of Organic EL Element

According to at least one embodiment, the layer structure of the organic EL elements includes the hole injection layers 15, the hole transport layers 16, the organic light-emitting layers 17, the intermediate layer 18, and the functional layer 19, but the layer structure is not limited to this. For example, the organic EL elements need not include the hole transport layers 16. Further, for example, instead of the hole injection layers 15 and the hole transport layers 16, hole injection transport layers may be provided. Further, for example, the hole injection layers 15 may each be two or more layers, and the hole transport layers 16 may each be two or more layers. In such cases, the hole injection layers 15 and the hole transport layers 16 may alternate in a stack.

Further, an electron injection layer may be disposed between the counter electrode 20 and the functional layer 19. According to at least one embodiment, the electron injection layer is a low work function metal such as lithium, barium, calcium, potassium, cesium, sodium, or rubidium. These metals have good electrical conduction, and therefore even if formed on the auxiliary electrodes 131 will have almost no effect on contact resistance between the auxiliary electrodes 131 and the counter electrode 20.

(3) In the organic EL display panel 10 according to at least one embodiment, as illustrated in FIG. 2, a direction of extension of the pixel regulation layers 141 is a long axis X direction of the organic EL display panel 10, and a direction of extension of the banks 14 is a short axis Y direction of the organic EL display panel 10, but extension directions of the pixel regulation layers 141 and the banks 14 may be switched. Further, directions of extension of the pixel regulation layers 141 and the banks 14 may be any directions regardless of the shape of the organic EL display panel 10.

Further, in the organic EL display panel 10 according to at least one embodiment, the image display surface is rectangular, but the shape of the image display surface is not limited to this example and may be changed as appropriate.

Further, in the organic EL display panel 10 according to at least one embodiment, the pixel electrodes 13 are each a rectangular flat plate shape, but the pixel electrodes 13 are not limited to this example.

According to at least one embodiment, the organic EL display panel is a line bank type of display panel, but the organic EL display panel may be a pixel bank type in which banks surround each sub-pixel in four directions. In a line bank design, an applied film such as one of the organic light-emitting layers 17 remains on the pixel regulation layers 141, and therefore an amount of ink dropped is larger than that used in a pixel bank design, and an amount of impurities such as water remaining after drying is correspondingly larger, and therefore an effect of adopting Yb having resistance to impurities as the metal dopant of the functional layer 19 becomes more significant.

(6) According to at least one embodiment, the auxiliary electrodes 131 are patterned so as to extend in the column direction in the auxiliary electrode areas CE (see FIG. 2) provided for each set of the sub-pixel columns CR, CG, CB, but the larger the contact area between the counter electrode 20 and the auxiliary electrodes 131, the more the voltage drop due to sheet resistance of the counter electrode 20 is suppressed. Therefore, the auxiliary electrodes 131 may be formed to correspond one-to-one with the sub-pixel columns.

Figure 19:
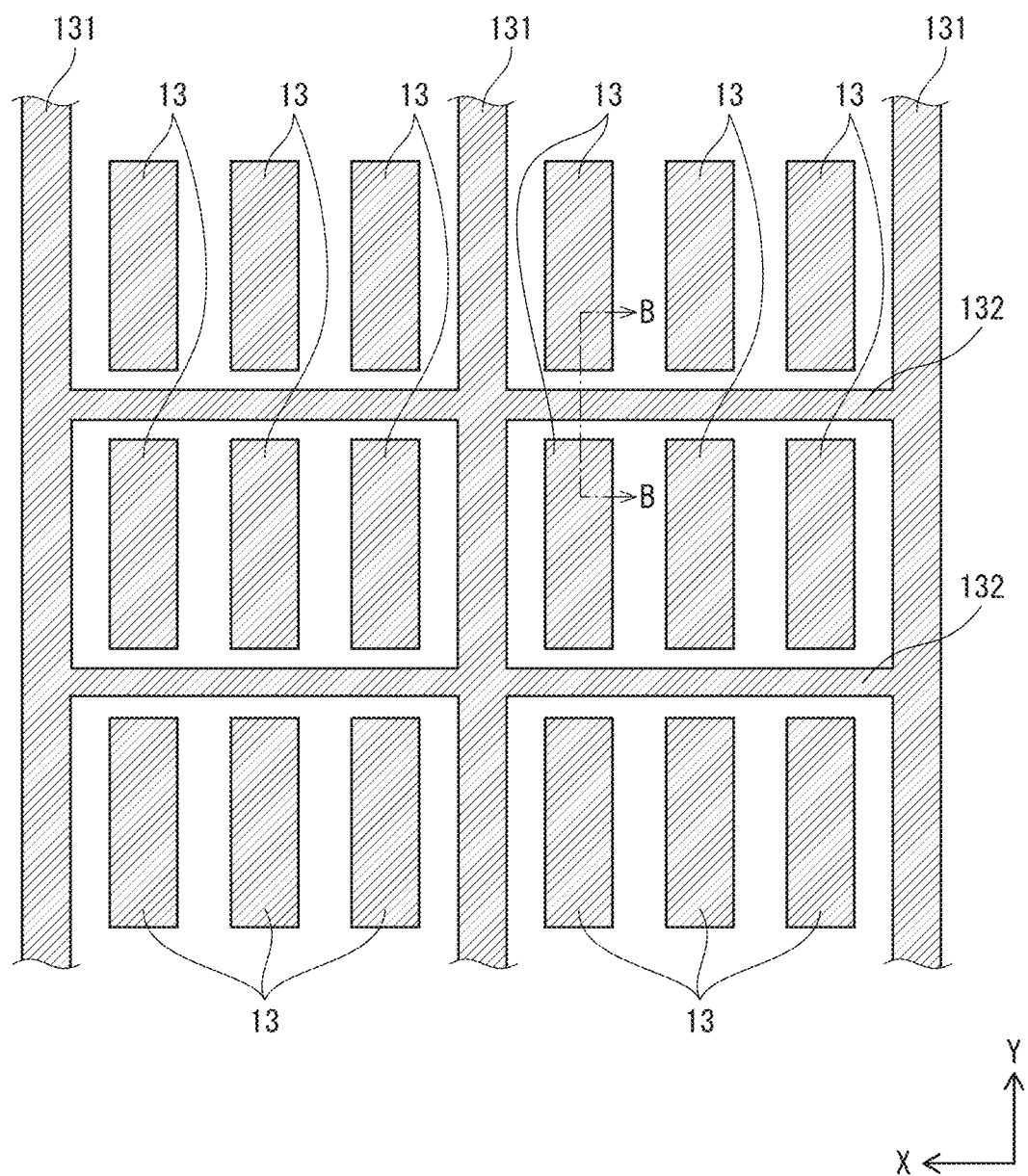
FIG. 19 is a plan view diagram illustrating a modification of a layout of pixel electrodes and an auxiliary electrode in an organic EL display panel according to at least one embodiment.

Further, in a pixel bank type of the organic EL display panel 10 in which the banks 14 are formed in the column direction and the row direction to surround each sub-pixel in four directions, then as illustrated in FIG. 19, row auxiliary electrodes 132 can be provided that extend in the row direction between the pixel electrodes 13 that are adjacent in the column direction, connecting to the auxiliary electrodes 131.

Figure 20:
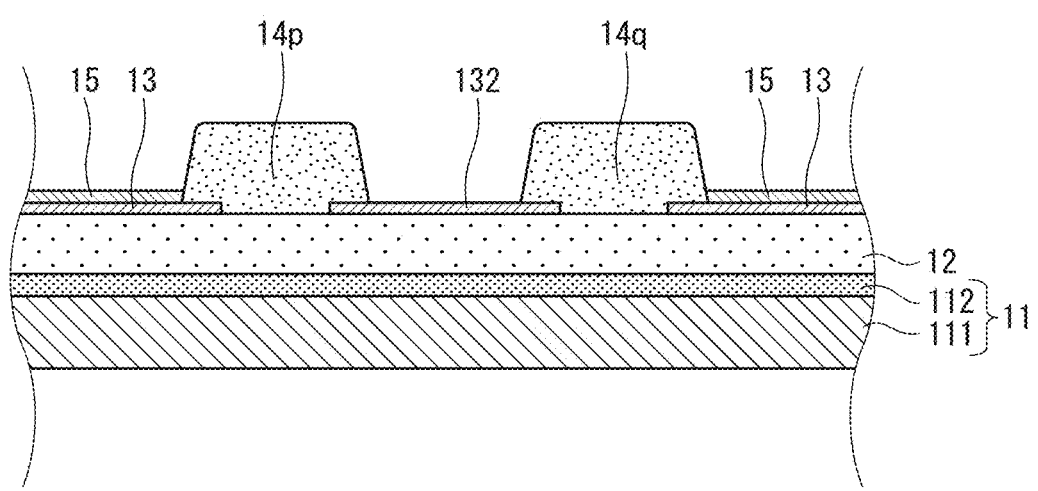
FIG. 20 is a schematic cross-section diagram of a portion of the modification illustrated in FIG. 19 indicated by a line B-B, at a stage where hole injection layers are formed after banks are formed on the substrate.

FIG. 20 is a schematic cross-section diagram of a portion of the organic EL display panel 10 corresponding to the line B-B in FIG. 19 at a stage where the hole injection layers 15 are formed after the banks are formed above the substrate 11.

The banks 14 extending in the row direction are separated into two sub-banks 14p, 14q, and the row auxiliary electrodes 132 are formed in auxiliary electrode areas between the sub-banks 14p, 14q.

However, as long as at least one auxiliary electrode extends in the column direction or the row direction, the voltage drop due to sheet resistance of the counter electrode 20 is alleviated to some extent.

(7) In the organic EL display panel 10 according to at least one embodiment there are the sub-pixels 100R, 100G, 100B that emit R, G, B colors of light, respectively, but light-emission colors of the sub-pixels are not limited to this example. For example, yellow (Y) may be used in addition to R, G, B. Further, in one pixel P, the number of sub-pixels of one color is not limited to one, and there may be two or more. Further, arrangement of sub-pixels in a pixel P are not limited to a sequence R, G, B as illustrated in FIG. 2, and may be in a different sequence.

(8) According to at least one embodiment, as illustrated in FIG. 3, film thicknesses of each layer of the organic EL elements are the same for each light emission color. When constructing an optical resonator structure, known optical designs are used to determine, according to wavelengths of each light emission color, (a) optical distance between reflective surfaces of the pixel electrode 13 and the counter electrode 20, (b) optical distance between the reflective surface of the pixel electrode 13 and an interface between the hole transport layer 16 and the organic light-emitting layer 17, (c) optical distance between the interface between the hole transport layer 16 and the organic light-emission layer 17 and the reflective surface of the counter electrode 20, and the like, and therefore film thicknesses of the hole transport layers 16, the organic light-emitting layers 17, the functional layer 19, the light-transmissive electrically conductive film 23, and the like are adjusted.

It might not be necessary to adopt an optical resonator structure for all light emission colors. Further, there may be a case where a plurality of sub-pixels of the same light emission color are included in one pixel, and a stack structure for such a display panel can be expressed as follows.

"A display panel in which pixels each including a plurality of light-emitting units are two-dimensionally arranged along a main surface of a substrate, where at least one light-emitting unit among the plurality has a different light emission color to another light-emitting unit among the plurality, and film thickness of the light-emitting layer and/or the functional layer of the at least one light-emitting unit is different from film thickness of a corresponding layer of the other light-emitting unit."

(9) The organic EL panel 10 according to at least one embodiment is an active matrix type, but the organic EL display panel 10 is not limited to this example and may be a passive matrix type. Further, the organic EL display panel 10 is not limited to being a top-emission type of display panel, and may be a bottom-emission type of display panel.

(10) An organic EL display panel using organic EL elements as light-emitting elements has been described according to at least one embodiment, but display panels such as quantum dot display panels that use quantum dot light-emitting diodes (QLED) as light-emitting elements (for example, see JP 2010-199067) are different in structure and type of light-emitting layer only, and have the same structure as organic EL display panels in which light-emitting layers and other functional layers are sandwiched between pixel electrodes and counter electrode, and therefore when the light-emitting layer and/or other functional layers are formed by an application process, the present disclosure is also applicable to such structures.

<<Supplement>>

A display panel and a method of manufacturing a display panel have been described based on embodiments and modifications thereof, but the present invention is not limited to the embodiments and modifications described above. Various modifications of the embodiments conceivable by a person having ordinary skill in the art, and any embodiment of a combination of elements and functions of the embodiments and modifications that does not depart from the spirit of the invention are also included in the present disclosure.

What is claimed is:

1. A display panel in which pixel electrodes are arranged in a matrix of rows and columns above a substrate and a light-emitting layer is disposed on or above each of the pixel electrodes, the display panel comprising:

- a power supplying auxiliary electrode disposed above the substrate in at least one gap among gaps between the pixel electrodes in a row direction and a column direction, in a non-contact state with the pixel electrodes, the power supplying auxiliary electrode extending in the row direction and/or the column direction;
- an intermediate layer disposed on or above the light-emitting layers and the auxiliary electrode, the intermediate layer including a fluoride of a first metal that is an alkali metal or an alkaline earth metal;
- a functional layer disposed on or above the intermediate layer, the functional layer including an organic material that has at least one of a property of facilitating electron transport and a property of facilitating electron injection and a dopant of a second metal that is a rare earth metal; and
- a counter electrode disposed on or above the functional layer, wherein $1 \leq x \leq 3, 20 \leq y \leq 40$, and $y \geq 10x+10$ where x is film thickness of the intermediate layer in nanometers, and y is percentage by weight of the second metal dopant in the functional layer.

2. The display panel of claim 1, wherein the first metal is Na.

3. The display panel of claim 1, wherein the second metal is Yb.

4. The display panel of claim 1, wherein the pixel electrodes and the power supplying auxiliary electrode are made of the same material.

5. The display panel of claim 1, wherein a proportion of the second metal to the organic material in the functional layer increases continuously with increasing proximity to the counter electrode.

6. The display panel of claim 1, wherein
the functional layer includes a first sublayer disposed on the intermediate layer and a second sublayer disposed on the first sublayer, and
a proportion of the second metal to the organic material in the second sublayer is greater than a proportion of the second metal to the organic material in the first sublayer.

7. The display panel of claim 1, wherein
the functional layer is a stack of a first sublayer, a second sublayer, and a third sublayer in this order of increasing distance from the intermediate layer, and $D2<D1 \leq D3$, where D1, D2, and D3 are proportions of the second metal to the organic material in the first sublayer, the second sublayer, and the third sublayer, respectively.

8. The display panel of claim 1, wherein a light-transmissive electrically conductive film is disposed between the functional layer and the counter electrode.

9. The display panel of claim 1, wherein the light-emitting layers are separated by banks that extend in the column direction between the pixel electrodes that are adjacent in the row direction.

10. The display panel of claim 1, wherein the display panel is a top-emission type of display panel.

* * * * *